United States Patent
Chiang et al.

(10) Patent No.: US 11,201,225 B2
(45) Date of Patent: Dec. 14, 2021

(54) STRUCTURE AND FORMATION METHOD OF SEMICONDUCTOR DEVICE WITH STRESSOR

(71) Applicant: Taiwan Semiconductor Manufacturing Co., Ltd., Hsinchu (TW)

(72) Inventors: Kuo-Cheng Chiang, Zhubei (TW); Shi-Ning Ju, Hsinchu (TW); Guan-Lin Chen, Baoshan Township, Hsinchu County (TW); Chih-Hao Wang, Baoshan Township, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/834,264

(22) Filed: Mar. 30, 2020

(65) Prior Publication Data
US 2021/0135008 A1    May 6, 2021

Related U.S. Application Data

(60) Provisional application No. 62/928,650, filed on Oct. 31, 2019.

(51) Int. Cl.
*H01L 29/423* (2006.01)
*H01L 29/78* (2006.01)
(Continued)

(52) U.S. Cl.
CPC .. *H01L 29/42392* (2013.01); *H01L 21/02532* (2013.01); *H01L 21/02603* (2013.01);
(Continued)

(58) Field of Classification Search
CPC ......... H01L 21/02518; H01L 21/02532; H01L 21/02587; H01L 21/0259; H01L 21/02603;
(Continued)

(56) References Cited

U.S. PATENT DOCUMENTS 9,209,247 B2    12/2015  Colinge et al.
9,236,267 B2    1/2016   De et al.
(Continued)

FOREIGN PATENT DOCUMENTS

| KR | 10-2015-0033496 A | 4/2015 |
| KR | 10-2018-0070316 A | 6/2018 |
| KR | 10-2019-0024600 A | 3/2019 |

OTHER PUBLICATIONS

Korean Notice of Allowance for Korean Application No. 10-2020-0079496, dated Apr. 30, 2021, with English translation.

*Primary Examiner* — Cheung Lee
(74) *Attorney, Agent, or Firm* — Birch, Stewart, Kolasch & Birch, LLP

(57) ABSTRACT

A semiconductor device structure and a method for forming a semiconductor device structure are provided. The semiconductor device structure includes multiple semiconductor nanostructures over a substrate and two epitaxial structures over the substrate. Each of the semiconductor nanostructures is between the epitaxial structures. The semiconductor device structure also includes a gate stack wrapping around the semiconductor nanostructures. The semiconductor device structure further includes a stressor structure between the gate stack and the substrate. The epitaxial structures extend exceeding a top surface of the stressor structure.

20 Claims, 26 Drawing Sheets

(51) Int. Cl.
  *H01L 29/06* (2006.01)
  *H01L 29/786* (2006.01)
  *H01L 29/66* (2006.01)
  *H01L 21/02* (2006.01)
  *H01L 21/762* (2006.01)

(52) U.S. Cl.
  CPC .. *H01L 21/02614* (2013.01); *H01L 21/76224* (2013.01); *H01L 29/0649* (2013.01); *H01L 29/0673* (2013.01); *H01L 29/66553* (2013.01); *H01L 29/66742* (2013.01); *H01L 29/7849* (2013.01); *H01L 29/78696* (2013.01)

(58) Field of Classification Search
  CPC ......... H01L 21/02614; H01L 21/76224; H01L 21/823412; H01L 21/823431; H01L 21/8238; H01L 21/823807; H01L 21/823821; H01L 27/085; H01L 27/088; H01L 27/0886; H01L 29/0649; H01L 29/0669; H01L 29/0673; H01L 29/42384; H01L 29/42392; H01L 29/66477; H01L 29/66553; H01L 29/66742; H01L 29/66795; H01L 29/7849; H01L 29/78696
  See application file for complete search history.

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 10,453,824 B1 * | 10/2019 | Mochizuki ........ H01L 21/02507 |
| 2016/0240652 A1 * | 8/2016 | Ching ............... H01L 29/42392 |
| 2017/0345945 A1 * | 11/2017 | Lee ....................... H01L 29/775 |

* cited by examiner

STRUCTURE AND FORMATION METHOD OF SEMICONDUCTOR DEVICE WITH STRESSOR

PRIORITY CLAIM AND CROSS-REFERENCE

This Application claims the benefit of U.S. Provisional Application No. 62/928,650, filed on Oct. 31, 2019, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation.

Over the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
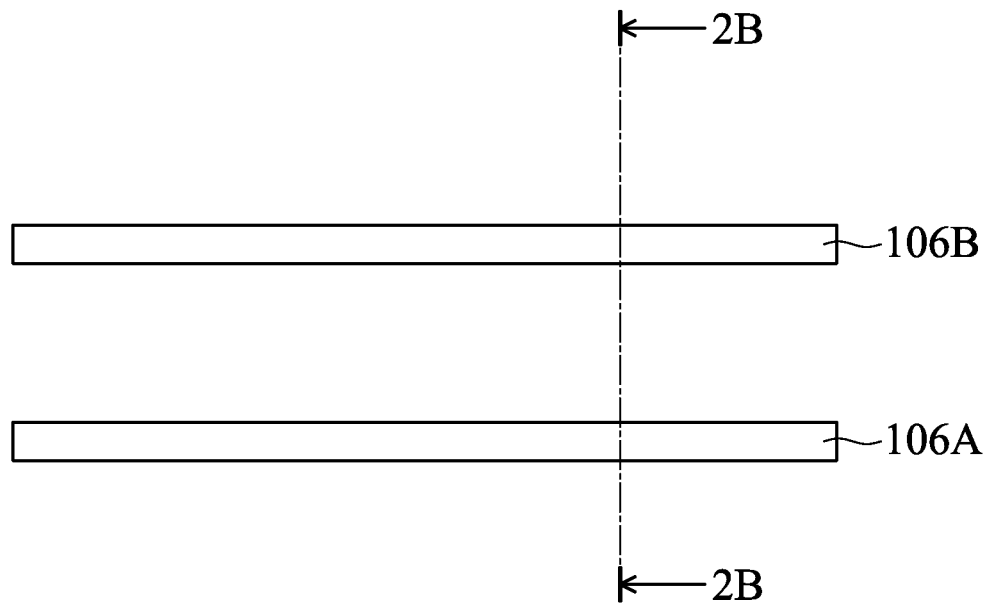
FIGS. 1A-1B are top views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5 or 10%.

Embodiments of the disclosure may relate to FinFET structure having fins. The fins may be patterned using any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. However, the fins may be formed using one or more other applicable processes.

Embodiments of the disclosure may relate to the gate all around (GAA) transistor structures. The GAA structure may be patterned using any suitable method. For example, the structures may be patterned using one or more photolithography processes, including double-patterning or multi-patterning processes. In some embodiments, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figure 2A:
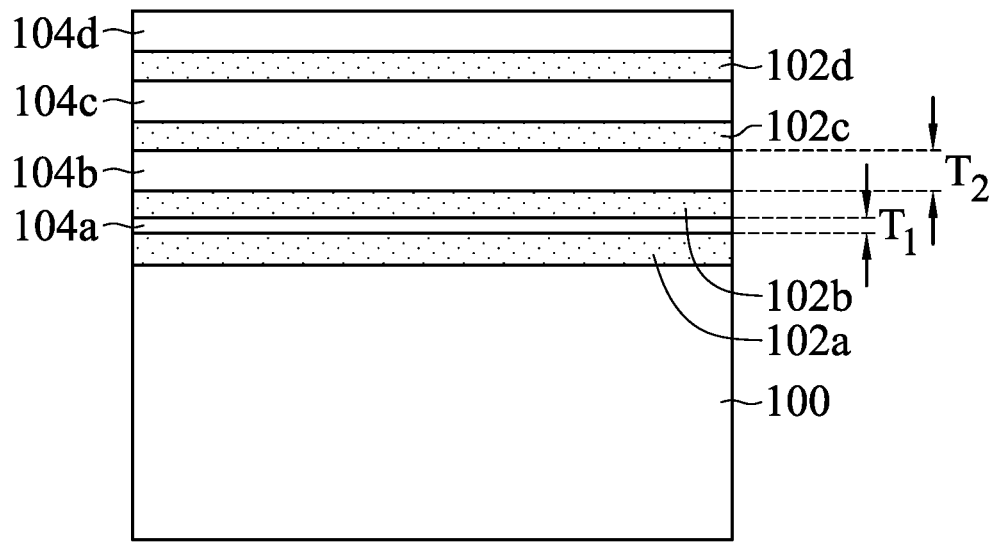
FIGS. 2A-2J are cross-sectional views of various stages of a process for forming a semiconductor device structure, in accordance with some embodiments.

FIGS. 2A-2J are cross-sectional views of various stages of a process for forming a semiconductor device structure, in accordance with some embodiments. As shown in FIG. 2A, a semiconductor substrate 100 is received or provided. In some embodiments, the semiconductor substrate 100 is a bulk semiconductor substrate, such as a semiconductor wafer. The semiconductor substrate 100 may include silicon or other elementary semiconductor materials such as germanium. The semiconductor substrate 100 may be un-doped or doped (e.g., p-type, n-type, or a combination thereof). In some embodiments, the semiconductor substrate 100 includes an epitaxially grown semiconductor layer on a dielectric layer. The epitaxially grown semiconductor layer may be made of silicon germanium, silicon, germanium, one or more other suitable materials, or a combination thereof.

In some other embodiments, the semiconductor substrate 100 includes a compound semiconductor. For example, the compound semiconductor includes one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions. Each of them is greater than or equal to zero, and added together they equal 1. The compound semiconductor may include silicon carbide, gallium arsenide, indium arsenide, indium phosphide, one or more other suitable compound semiconductors, or a combination thereof. Other suitable substrate including II-VI compound semiconductors may also be used.

In some embodiments, the semiconductor substrate 100 is an active layer of a semiconductor-on-insulator (SOI) substrate. The SOI substrate may be fabricated using a separation by implantation of oxygen (SIMOX) process, a wafer bonding process, another applicable method, or a combination thereof. In some other embodiments, the semiconductor substrate 100 includes a multi-layered structure. For example, the semiconductor substrate 100 includes a silicon-germanium layer formed on a bulk silicon layer.

As shown in FIG. 2A, a semiconductor stack having multiple semiconductor layers is formed over the semiconductor substrate 100, in accordance with some embodiments. In some embodiments, the semiconductor stack includes multiple semiconductor layers 102a, 102b, 102c, and 102d, and the semiconductor stack also includes multiple semiconductor layers 104a, 104b, 104c, and 104d. In some embodiments, the semiconductor layers 102a-102d and the semiconductor layers 104a-104d are laid out alternately, as shown in FIG. 2A.

In some embodiments, the semiconductor layer 102a is used as a base layer that will be partially or completely transformed into a stressor structure later. In some embodiments, the semiconductor layer 104a functions as a protective layer that prevents the semiconductor layer 102a from being damaged during the subsequent fabrication processes. In some embodiments, the semiconductor layer 104a is thinner than the semiconductor layer 104b, 104c, or 104d. In some embodiments, the semiconductor layers 102b-102d function as sacrificial layers that will be removed in subsequent processes to release the semiconductor layers 104b-104d. The semiconductor layers 104b-104d may function as channel structures of one or more transistors.

As shown in FIG. 2A, the semiconductor layer 104a has a thickness $T_1$, and the semiconductor layer 104b has a thickness $T_2$. In some embodiments, the thickness $T_2$ is greater than the thickness $T_1$. The thickness $T_1$ may be in a range from about 2 nm to about 6 nm. For example, the thickness $T_1$ is about 4 nm. The ratio ($T_1/T_2$) of the thickness $T_1$ to the thickness $T_2$ may be in a range from about 2/5 to about 2/3.

In some embodiments, each of the semiconductor layers 102a-102d and 104b-104d has substantially the same thickness. In some embodiments, each of the semiconductor layers 104b-104d is thicker than each of the semiconductor layers 102a-102d. In some other embodiments, each of the semiconductor layers 102a-102d is thicker than each of the semiconductor layers 104b-104d.

In some embodiments, the semiconductor layers 102a-102d and the semiconductor layers 104a-104d are made of different materials. In some embodiments, the semiconductor layers 102a-102d are made of or include silicon germanium or germanium, and the semiconductor layers 104a-104d are made of or include silicon.

In some embodiments, the semiconductor layers 102a-102d and the semiconductor layers 104a-104d are formed using multiple epitaxial growth operations. Each of the semiconductor layers 102a-102d and the semiconductor layers 104a-104d may be formed using a selective epitaxial growth (SEG) process, a CVD process (e.g., a vapor-phase epitaxy (VPE) process, a low-pressure chemical vapor deposition (LPCVD) process, and/or an ultra-high vacuum CVD (UHV-CVD) process), a molecular beam epitaxy process, one or more other applicable processes, or a combination thereof. In some embodiments, the semiconductor layers 102a-102d and the semiconductor layers 104a-104d are grown in-situ in the same process chamber. In some embodiments, the growth of the semiconductor layers 102a-102d and the growth of the semiconductor layers 104a-104d are alternately and sequentially performed in the same process chamber to complete the formation of the semiconductor stack. In some embodiments, the vacuum of the process chamber is not broken before the epitaxial growth of the semiconductor stack is accomplished.

Figure 2B:
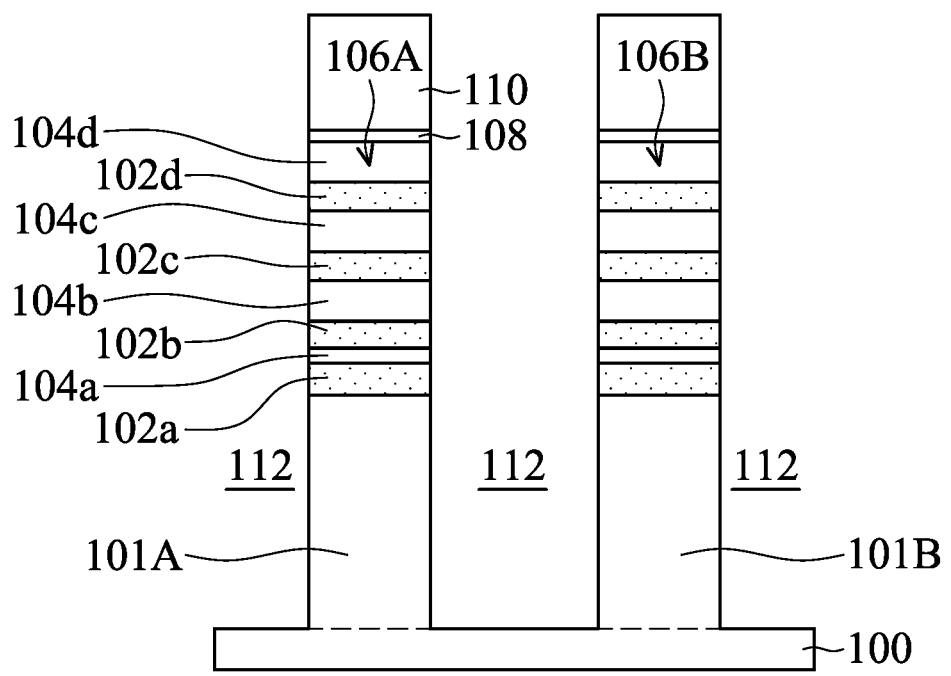

Afterwards, hard mask elements are formed over the semiconductor stack to assist in a subsequent patterning of the semiconductor stack. One or more etching processes are used to pattern the semiconductor stack into fin structures 106A and 106B, as shown in FIG. 2B in accordance with some embodiments. The semiconductor stack is partially removed to form trenches 112, as shown in FIG. 2B. Each of the fin structures 106A and 106B may include portions of the semiconductor layers 102a-102d and 104a-104d and semiconductor fins 101A and 101B. The semiconductor substrate 100 may also be partially removed during the etching process for forming the fin structures 106A and 106B. Protruding portions of the semiconductor substrate 100 that remain form the semiconductor fins 101A and 101B.

Each of the hard mask elements may include a first mask layer 108 and a second mask layer 110. The first mask layer 108 and the second mask layer 110 may be made of different materials. In some embodiments, the first mask layer 108 is made of a material that has good adhesion to the semiconductor layer 104d. The first mask layer 108 may be made of silicon oxide, germanium oxide, silicon germanium oxide, one or more other suitable materials, or a combination thereof. In some embodiments, the second mask layer 110 is made of a material that has good etching selectivity to the semiconductor layers 102a-102d and 104a-104d. The second mask layer 110 may be made of silicon nitride, silicon oxynitride, silicon carbide, one or more other suitable materials, or a combination thereof.

Figure 1B:
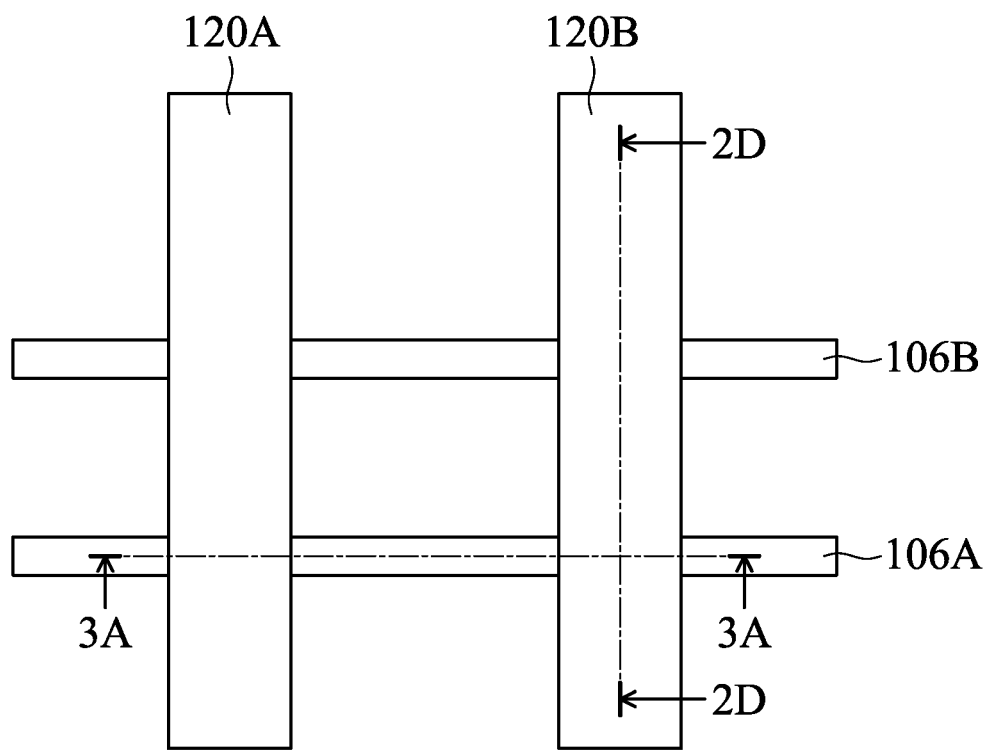

FIGS. 1A-1B are top views of various stages of a process for forming a semiconductor device structure, in accordance with some embodiments. In some embodiments, FIG. 2B is a cross-sectional view of the structure taken along the line 2B-2B in FIG. 1A. In some embodiments, the extending directions of the fin structures 106A and 106B are substantially parallel to each other, as shown in FIG. 1A.

Figure 2C:
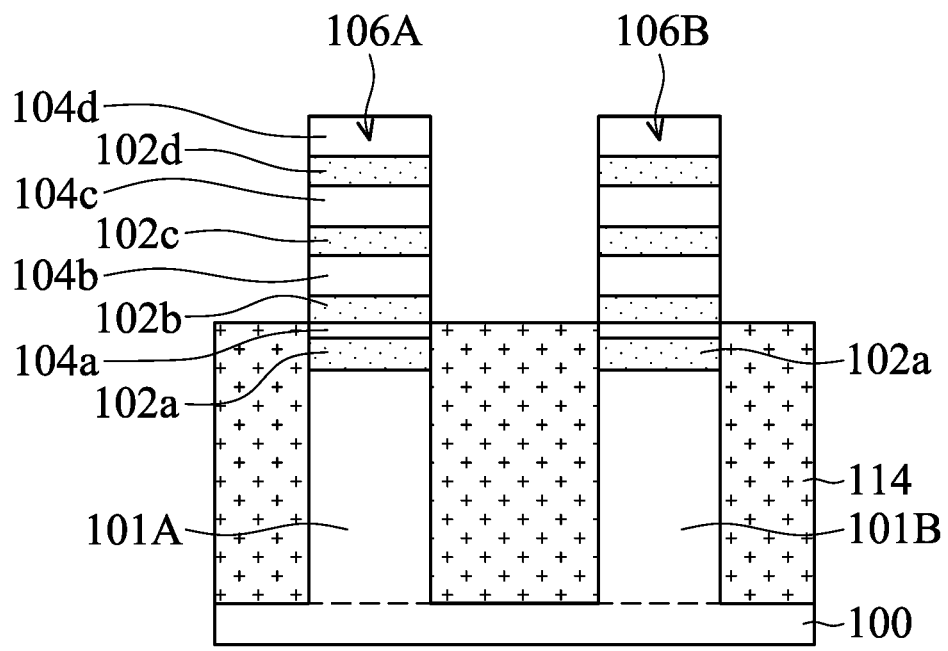

As shown in FIG. 2C, an isolation structure 114 is formed to surround lower portions of the fin structures 106A and 106B, in accordance with some embodiments. In some embodiments, one or more dielectric layers are deposited over the fin structures 106A and 106B and the semiconductor substrate 100 to overfill the trenches 112. The dielectric layers may be made of silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable materials, or a combination thereof. The dielectric layers may be deposited using a flowable chemical vapor deposition (FCVD) process, an atomic layer deposition (ALD) process, a chemical vapor deposition (CVD) process, one or more other applicable processes, or a combination thereof.

Afterwards, a planarization process is used to partially remove the dielectric layers. The hard mask elements (including the first mask layer 108 and the second mask layer 110) may also function as a stop layer of the planarization process. The planarization process may include a chemical mechanical polishing (CMP) process, a grinding process, a dry polishing process, an etching process, one or more other applicable processes, or a combination thereof. Afterwards, one or more etching back processes are used to partially remove the dielectric layers. As a result, the remaining portion of the dielectric layers forms the isolation structure 114. Upper portions of the fin structures 106A and 106B protrude from the top surface of the isolation structure 114, as shown in FIG. 2C.

In some embodiments, the etching back process for forming the isolation structure 114 is carefully controlled to ensure that the top surface of the isolation structure 114 is higher than the top surface of the semiconductor layer 102a, as shown in FIG. 2C. The sidewalls of the semiconductor layer 102a are thus protected by the isolation structure 114. The isolation structure 114 and the semiconductor layer 104a together protect the semiconductor layer 102a to prevent the semiconductor layer 102a from being damaged during the subsequent processes.

Figure 2D:
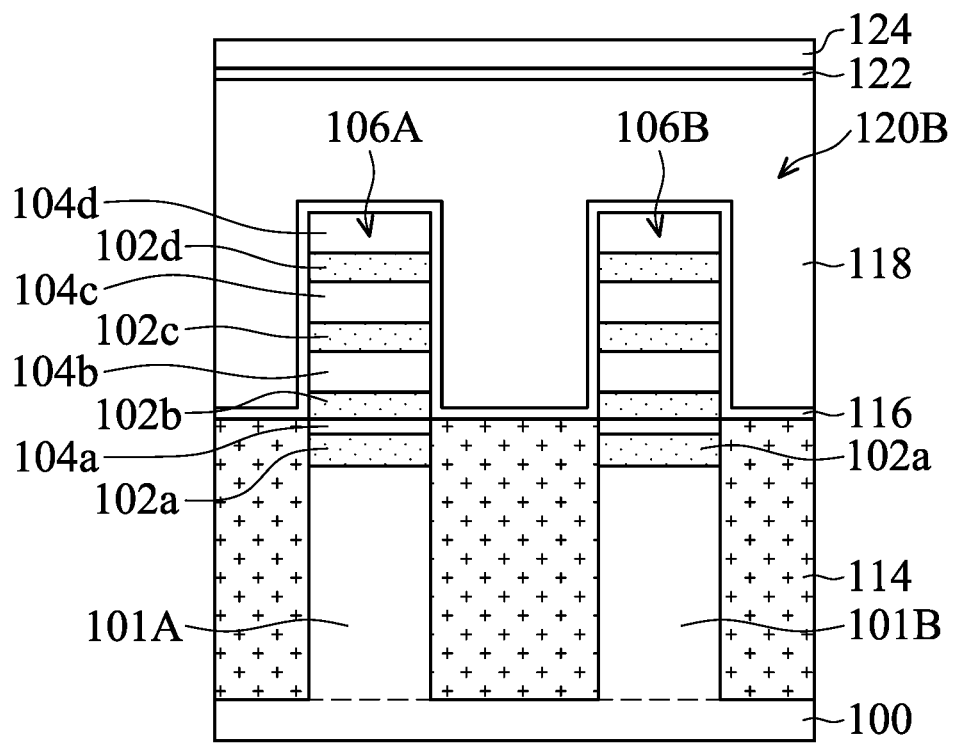
Figure 3A:
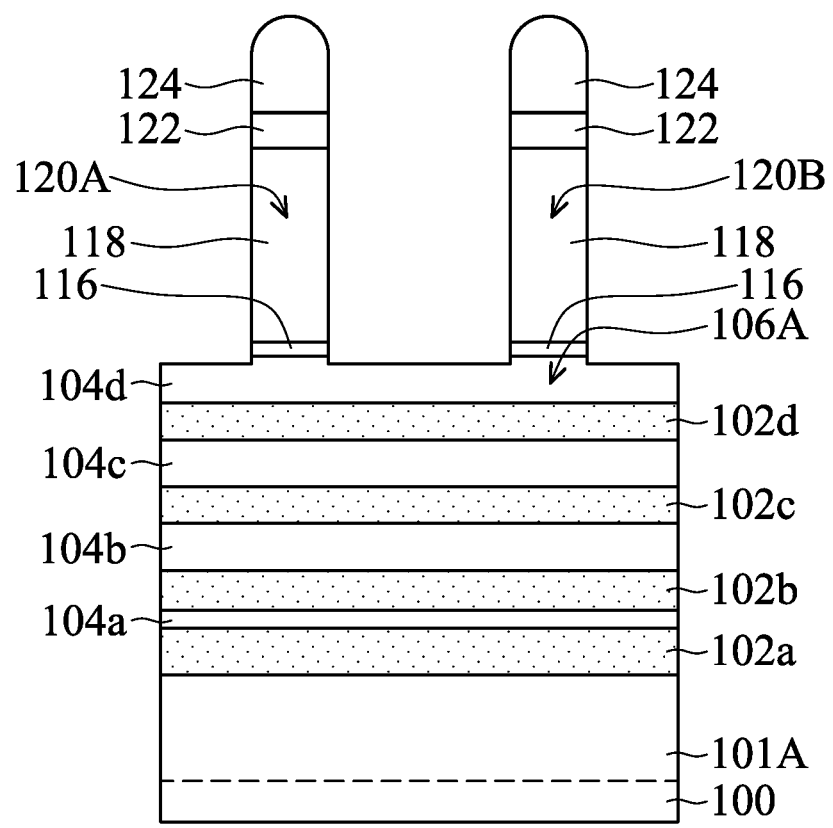
FIGS. 3A-3N are cross-sectional views of various stages of a process for forming a semiconductor device structure, in accordance with some embodiments.

Afterwards, dummy gate stacks 120A and 120B are formed to extend across the fin structures 106A and 106B, as shown in FIG. 1B in accordance with some embodiments. In some embodiments, FIG. 2D is a cross-sectional view of the structure taken along the line 2D-2D in FIG. 1B. FIGS. 3A-3N are cross-sectional views of various stages of a process for forming a semiconductor device structure, in accordance with some embodiments. In some embodiments, FIG. 3A is a cross-sectional view of the structure taken along the line 3A-3A in FIG. 1B.

As shown in FIGS. 1B, 2D, and 3A, the dummy gate stacks 120A and 120B are formed to partially cover and to extend across the fin structures 106A and 106B, in accordance with some embodiments. In some embodiments, the dummy gate stacks 120A and 120B wraps around the fin structures 106A and 106B. As shown in FIG. 2D, the dummy gate stack 120B extends across and wraps around the fin structures 106A and 106B.

As shown in FIGS. 2D and 3A, each of the dummy gate stacks 120A and 120B includes a dummy gate dielectric layer 116 and a dummy gate electrode 118. The dummy gate dielectric layers 116 may be made of or include silicon oxide. The dummy gate electrodes 118 may be made of or include polysilicon. In some embodiments, a dummy gate dielectric material layer and a dummy gate electrode layer are sequentially deposited over the isolation structure 114 and the fin structures 106A and 106B. Afterwards, the dummy gate dielectric material layer and the dummy gate electrode layer are patterned to form the dummy gate stacks 120A and 120B.

In some embodiments, hard mask elements including mask layers 122 and 124 are used to assist in the patterning process for forming the dummy gate stacks 120A and 120B. With the hard mask elements as an etching mask, one or more etching processes are used to partially remove the dummy gate dielectric material layer and the dummy gate electrode layer. As a result, remaining portions of the dummy gate dielectric material layer and the dummy gate electrode layer form the dummy gate dielectric layers 116 and the dummy gate electrodes 118 of the dummy gate stacks 120A and 120B, respectively.

Figure 3B:
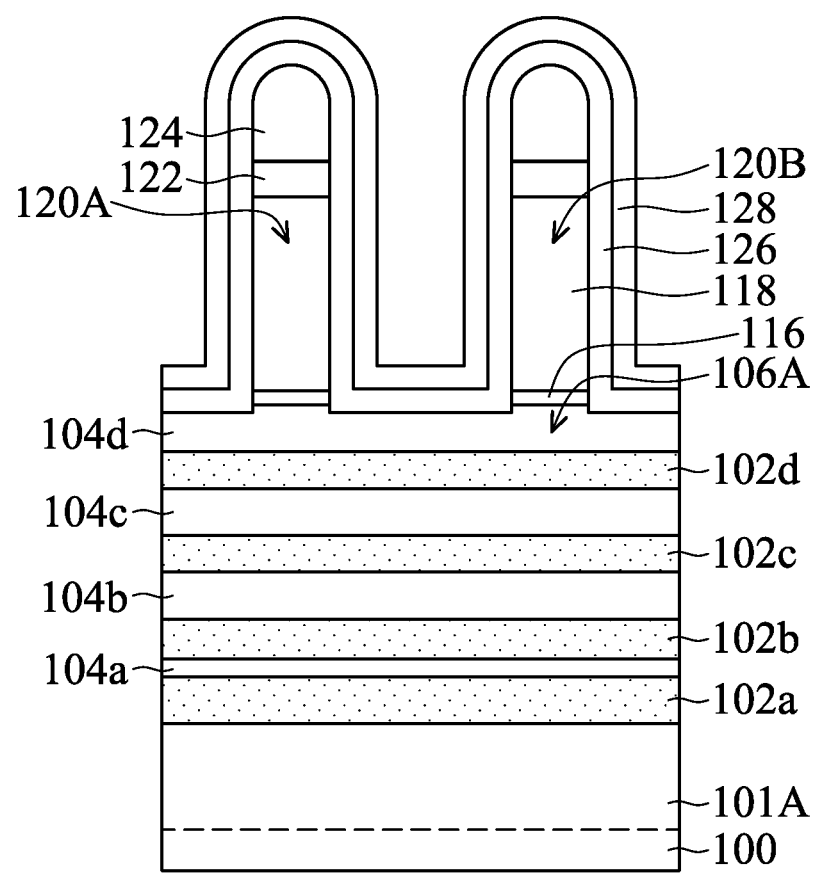

As shown in FIG. 3B, spacer layers 126 and 128 are afterwards deposited over the structure shown in FIG. 3A, in accordance with some embodiments. The spacer layers 126 and 128 extend along the sidewalls of the dummy gate stacks 120A and 120B. The spacer layers 126 and 128 are made of different materials. The spacer layer 126 may be made of a dielectric material that has a low dielectric constant. The spacer layer 126 may be made of or include silicon carbide, silicon oxycarbide, silicon oxide, one or more other suitable materials, or a combination thereof. The spacer layer 128 may be made of a dielectric material that can provide more protection to the gate stacks during subsequent processes. The spacer layer 128 may have a dielectric constant that is greater than that of the spacer layer 126. The spacer layer 128 may be made of silicon nitride, silicon oxynitride, carbon-containing silicon nitride, carbon-containing silicon oxynitride, one or more other suitable materials, or a combination thereof. The spacer layers 126 and 128 may be sequentially deposited using a CVD process, an ALD process, a physical vapor deposition (PVD) process, one or more other applicable processes, or a combination thereof.

Figure 3C:
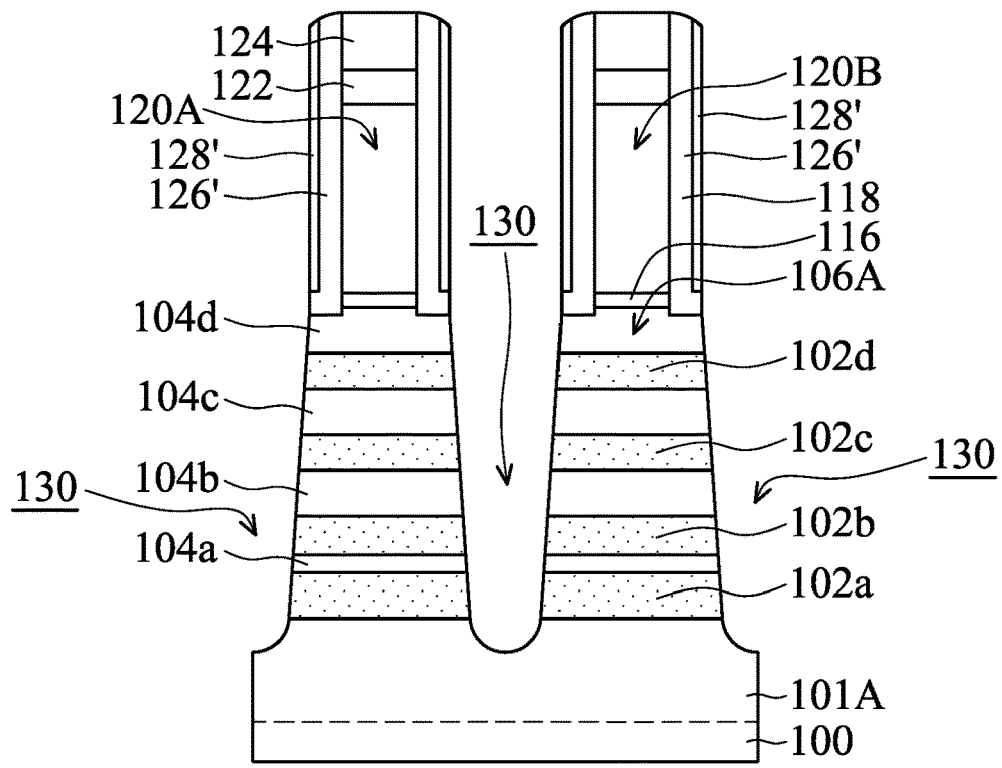

As shown in FIG. 3C, the spacer layers 126 and 128 are partially removed, in accordance with some embodiments. One or more anisotropic etching processes may be used to partially remove the spacer layers 126 and 128. As a result, remaining portions of the spacer layers 126 and 128 form spacer elements 126' and 128', respectively. The spacer elements 126' and 128' extend along the sidewalls of the dummy gate stacks 120A and 120B, as shown in FIG. 3C.

Afterwards, the fin structures 106A and 106B are partially removed to form recesses 130 that are used to contain epitaxial structures (such as source/drain structures) that will be formed later. As shown in FIG. 3C, the fin structure 106A is partially removed to form the recesses 130, in accordance with some embodiments. One or more etching processes may be used to form the recesses 130. In some embodiments, a dry etching process is used to form the recesses 130. Alternatively, a wet etching process may be used to form the recesses 130. In some embodiments, each of the recesses 130 penetrates through the fin structure 106A. In some embodiments, the recesses 130 further extend into the semiconductor fin 101A, as shown in FIG. 3C.

In some embodiments, each of the recesses 130 has slanted sidewalls. Upper portions of the recesses 130 are larger (or wider) than lower portions of the recesses 130. In these cases, due to the profile of the recesses 130, an upper semiconductor layer (such as the semiconductor layer 104d) is shorter than a lower semiconductor layer (such as the semiconductor layer 104b).

However, embodiments of the disclosure have many variations. In some other embodiments, the recesses 130 have substantially vertical sidewalls. In these cases, due to the profile of the recesses 130, an upper semiconductor layer (such as the semiconductor layer 104d) is substantially as wide as a lower semiconductor layer (such as the semiconductor layer 104b).

Figure 3D:
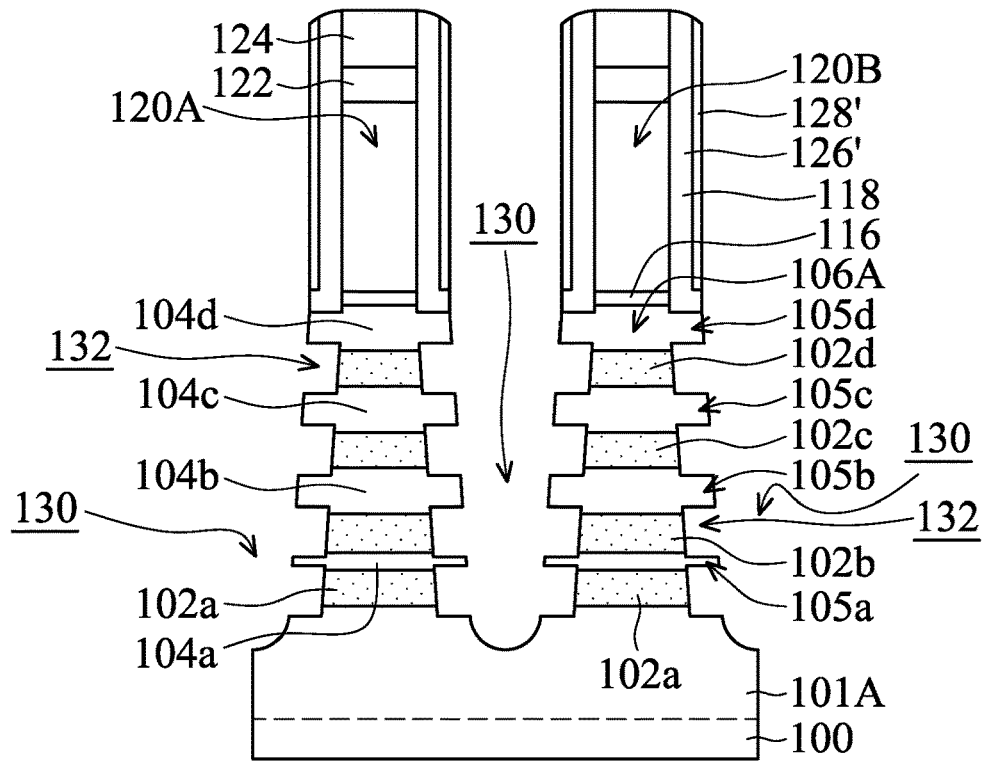

As shown in FIG. 3D, the semiconductor layers 102a-102d are laterally etched, in accordance with some embodiments. As a result, edges of the semiconductor layers 102a-102d retreat from edges of the semiconductor layers 104a-104d. As shown in FIG. 3D, recesses 132 are formed due to the lateral etching of the semiconductor layers 102a-102d. The recesses 132 may be used to contain inner spacers that will be formed later. The semiconductor layers 102a-102d may be laterally etched using a wet etching process, a dry etching process, or a combination thereof.

During the lateral etching of the semiconductor layers 102a-102d, the semiconductor layers 104a-104d may also be slightly etched. As a result, edge portions of the semiconductor layers 104a-104d are partially etched and thus shrink to become edge elements 105a-105d, as shown in FIG. 3D. As shown in FIG. 3D, each of the edge elements 105a-105d of the semiconductor layers 104a-104d is thinner than the corresponding inner portion. In some embodiments, each of the edge elements 105a is thinner than another upper edge element such as the edge elements 105b-105d.

Figure 3E:
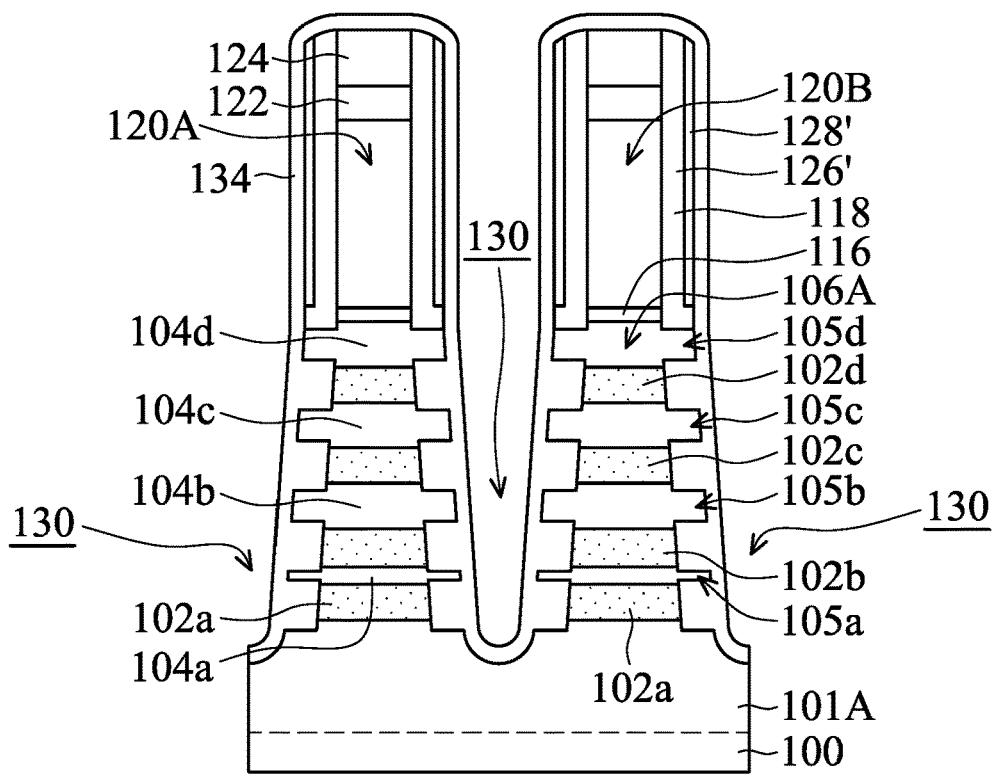

As shown in FIG. 3E, a spacer layer 134 is deposited over the structure shown in FIG. 3D, in accordance with some embodiments. The spacer layer 134 covers the dummy gate stacks 120A and 120B and overfills the recesses 132. The spacer layer 134 may be made of or include carbon-containing silicon nitride (SiCN), carbon-containing silicon oxynitride (SiOCN), carbon-containing silicon oxide (SiOC), one or more other suitable materials, or a combination thereof. The spacer layer 134 may be deposited using a CVD process, an ALD process, one or more other applicable processes, or a combination thereof.

Figure 3F:
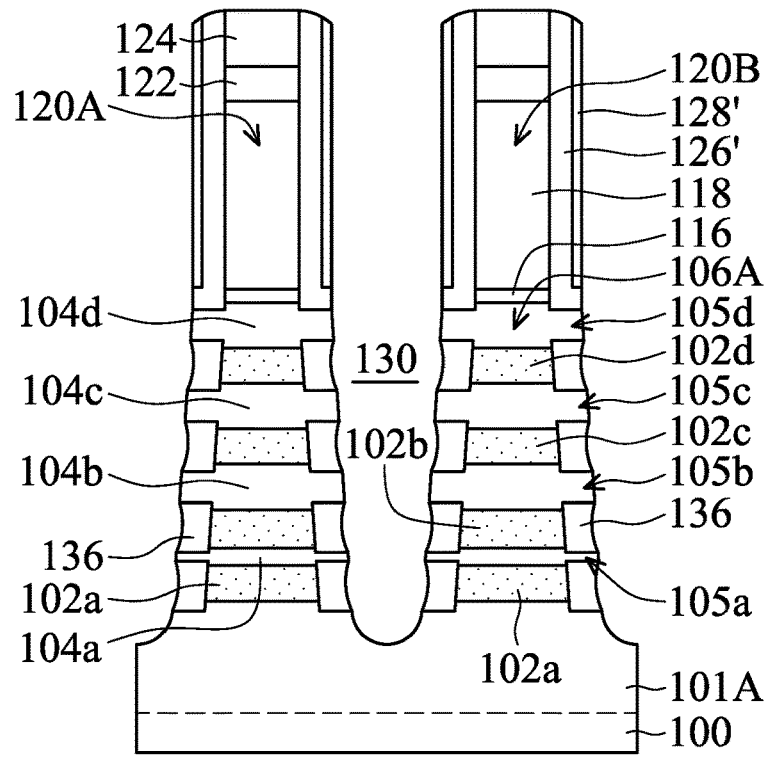

As shown in FIG. 3F, an etching process is used to partially remove the spacer layer 134, in accordance with some embodiments. The remaining portions of the spacer layer 134 form inner spacers 136, as shown in FIG. 3F. The etching process may include a dry etching process, a wet etching process, or a combination thereof.

The inner spacers 136 cover the edges of the semiconductor layers 102a-102d that are originally exposed by the recesses 132. In some embodiments, after the etching process for forming the inner spacers 136, portions of the semiconductor fin 101A originally covered by the spacer layer 134 are exposed by the recesses 130, as shown in FIG. 3F. The inner spacers 136 may be used to prevent subsequently formed epitaxial structures (that function as, for example, source/drain structures) from being damaged during a subsequent gate replacement process. The inner spacers 136 may also be used to reduce parasitic capacitance between the subsequently formed source/drain structures and the gate stacks.

Figure 3G:
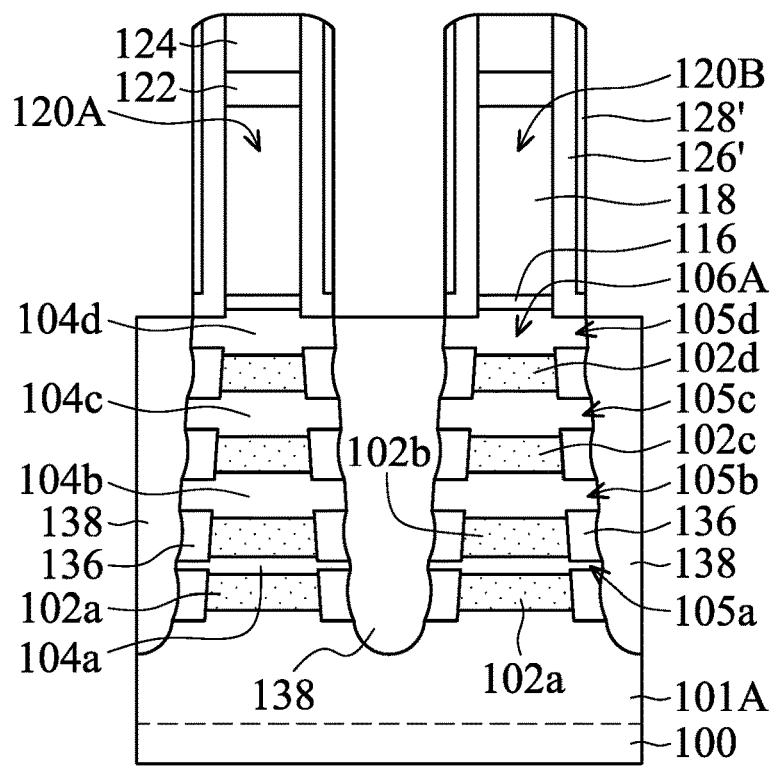

As shown in FIG. 3G, epitaxial structures 138 are formed beside the dummy gate stacks 120A and 120B, in accordance with some embodiments. In some embodiments, the epitaxial structures 138 fill the recesses 130, as shown in FIG. 3G. In some other embodiments, the epitaxial structures 138 overfill the recesses 130. In these cases, the top surfaces of the epitaxial structures 138 may be higher than the top surface of the dummy gate dielectric layer 116. In some other embodiments, the epitaxial structures 138 partially fill the recesses 130.

In some embodiments, the epitaxial structures 138 connect to the semiconductor layers 104a-104d. Each of the semiconductor layers 104a-104d is sandwiched between two of the epitaxial structures 138. In some embodiments, the epitaxial structures 138 function as source/drain structures. In some embodiments, the epitaxial structures 138 are n-type regions. The epitaxial structures 138 may include epitaxially grown silicon, epitaxially grown silicon carbide (SiC), epitaxially grown silicon phosphide (SiP), or another suitable epitaxially grown semiconductor material.

In some embodiments, the epitaxial structures 138 are formed using a selective epitaxial growth (SEG) process, a CVD process (e.g., a vapor-phase epitaxy (VPE) process, a low-pressure chemical vapor deposition (LPCVD) process, and/or an ultra-high vacuum CVD (UHV-CVD) process), a molecular beam epitaxy process, one or more other applicable processes, or a combination thereof.

In some embodiments, the epitaxial structures 138 are doped with one or more suitable dopants. For example, the epitaxial structures 138 are Si source/drain features doped with phosphor (P), antimony (Sb), or another suitable dopant.

In some embodiments, the epitaxial structures 138 are doped in-situ during their epitaxial growth. In some other embodiments, the epitaxial structures 138 are not doped during the growth of the epitaxial structures 138. Instead, after the formation of the epitaxial structures 138, the epitaxial structures 138 are doped in a subsequent process. In some embodiments, the doping is achieved by using an ion implantation process, a plasma immersion ion implantation process, a gas and/or solid source diffusion process, one or more other applicable processes, or a combination thereof. In some embodiments, the epitaxial structures 138 are further exposed to one or more annealing processes to activate the dopants. For example, a rapid thermal annealing process is used.

Figure 3H:
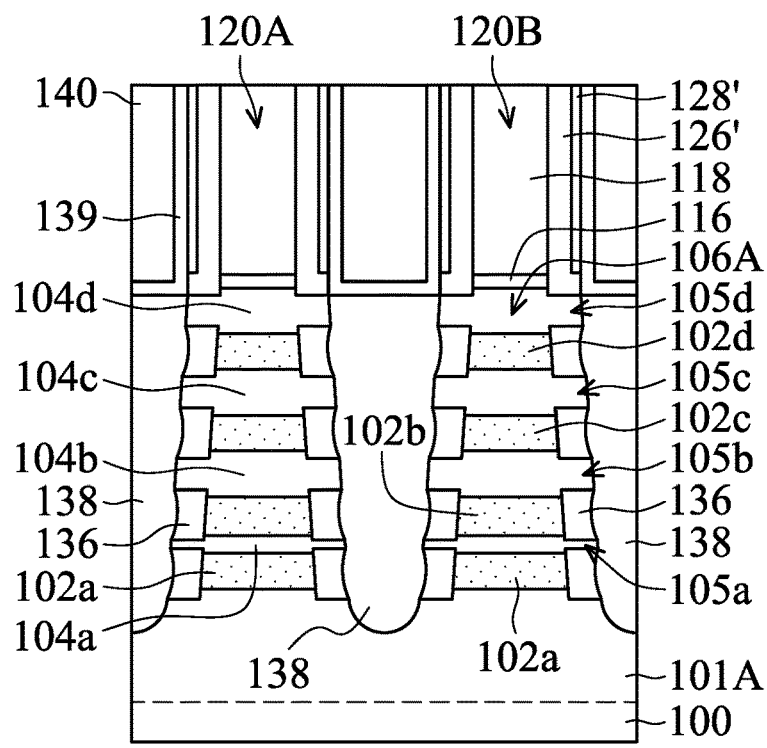

As shown in FIG. 3H, a contact etch stop layer 139 and a dielectric layer 140 are formed to cover the epitaxial structures 138 and to surround the dummy gate stacks 120A and 120B, in accordance with some embodiments. The contact etch stop layer 139 may be made of or include silicon nitride, silicon oxynitride, silicon carbide, aluminum oxide, one or more other suitable materials, or a combination thereof. The dielectric layer 140 may be made of or include silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable materials, or a combination thereof.

In some embodiments, an etch stop material layer and a dielectric material layer are sequentially deposited over the structure shown in FIG. 3G. The etch stop material layer may be deposited using a CVD process, an ALD process, a PVD process, one or more other applicable processes, or a combination thereof. The dielectric material layer may be deposited using an FCVD process, a CVD process, an ALD process, one or more other applicable processes, or a combination thereof.

Afterwards, a planarization process is used to partially remove the etch stop material layer and the dielectric material layer. As a result, the remaining portions of the etch stop material layer and the dielectric material layer form the contact etch stop layer 139 and the dielectric layer 140, respectively. The planarization process may include a CMP process, a grinding process, an etching process, a dry polishing process, one or more other applicable processes, or a combination thereof. In some embodiments, the mask layers 122 and 124 are removed during the planarization process. In some embodiments, after the planarization process, the top surfaces of the contact etch stop layer 139, the dielectric layer 140, and the dummy gate electrodes 118 are substantially coplanar.

Figure 2E:
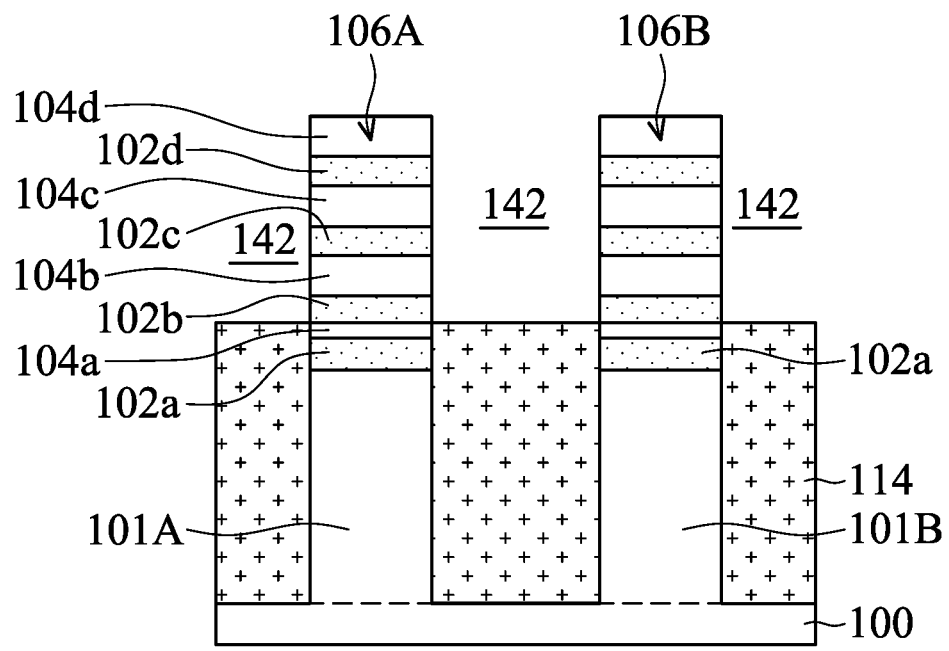
Figure 3I:
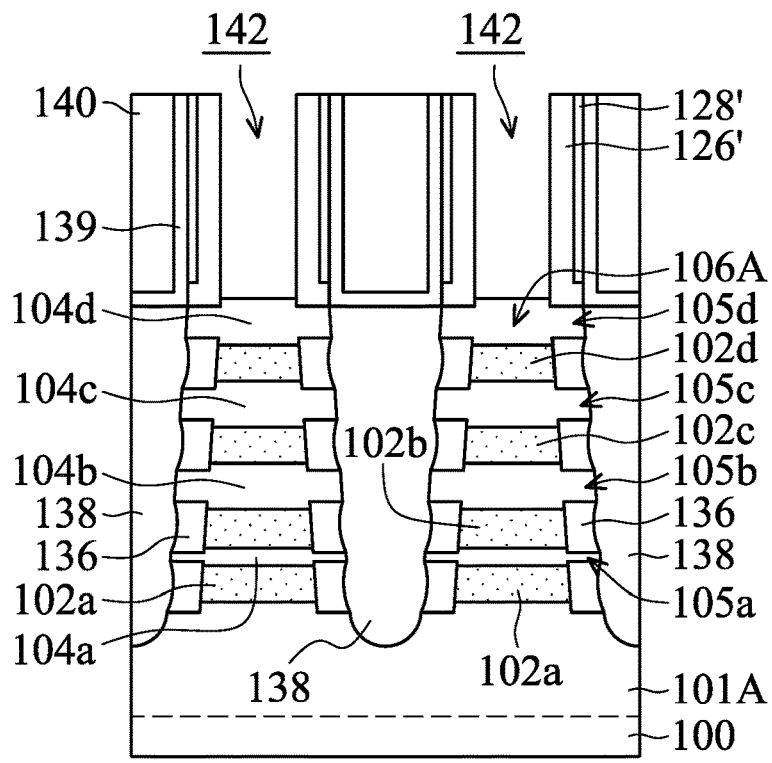

As shown in FIGS. 2E and 3I, one or more etching processes are used to remove the dummy gate stacks 120A and 120B to form trenches 142, in accordance with some embodiments. As shown in FIG. 2E, the trenches 142 expose the semiconductor layers 102b-102d and 104b-104d that are originally covered by the dummy gate stacks 120A and 120B. In some embodiments, the semiconductor layers 102a and 104a remain being covered by the semiconductor layer 102b and the isolation structure 114 without being exposed by the trenches 142, as shown in FIG. 2E.

Figure 2F:
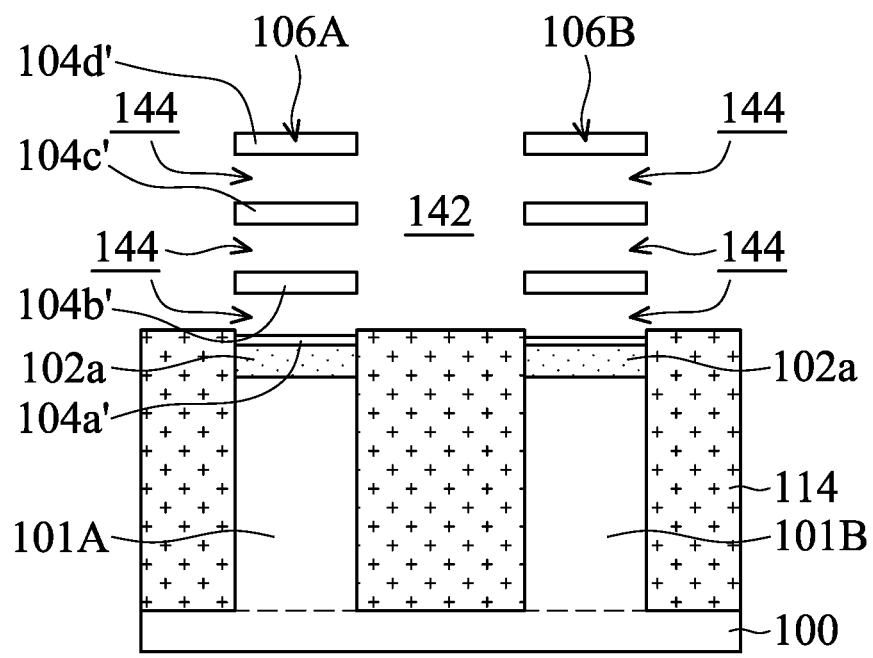
Figure 3J:
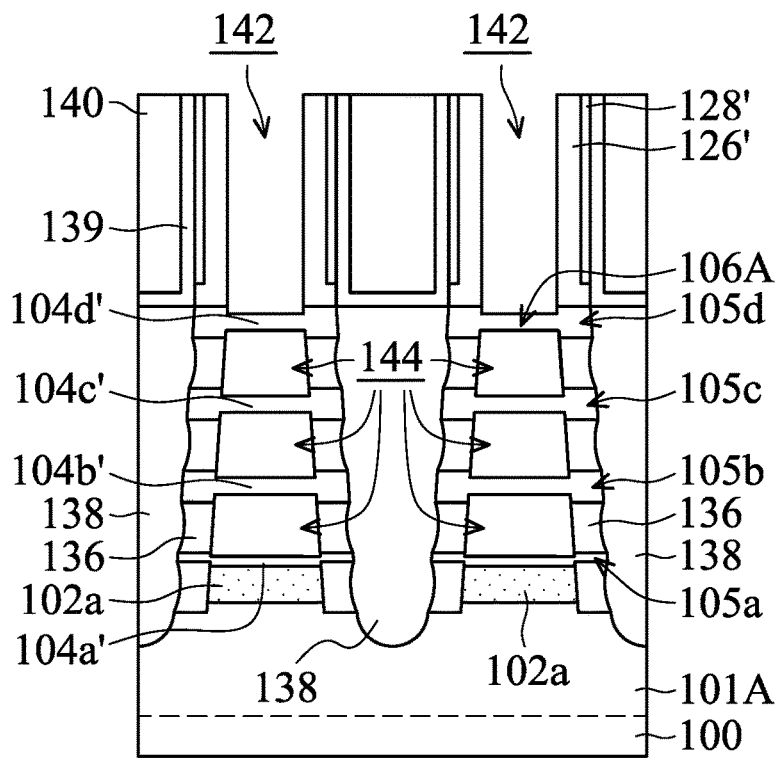

As shown in FIGS. 2F and 3J, the semiconductor layers 102b-102d (that function as sacrificial layers) are removed to form recesses 144, in accordance with some embodiments. In some embodiments, an etching process is used to remove the semiconductor layers 102b-102d. Due to high etching selectivity, the semiconductor layers 104a-104d are substantially not (or slightly) etched. The remaining portions of the semiconductor layers 104a-104d form multiple semiconductor nanostructures 104a'-104d' of the fin structures 106A and 106B, as shown in FIGS. 2F and 3J. The semiconductor nanostructures 104a'-104d' are constructed by the remaining portion of the semiconductor layer 104a-104d.

In some embodiments, the etchant used for removing the semiconductor layers 102b-102d also slightly removes the semiconductor layers 104a-104d that form the semiconductor nanostructures 104a'-104d'. As a result, the obtained semiconductor nanostructures 104a'-104d' become thinner after the removal of the semiconductor layers 102b-102d. In some embodiments, each of the semiconductor nanostructures 104b'-104d' is thinner than the edge portions 105b-105d since the edge portions 105b-105d are surrounded by other elements and thus are prevented from being reached and etched by the etchant.

After the removal of the semiconductor layers 102b-102d (that function as sacrificial layers), recesses 144 are formed. The recesses 144 connect to the trench 142 and surround each of the semiconductor nanostructures 104b'-104d'. As shown in FIG. 3J, even if the recesses 144 between the semiconductor nanostructures 104a'-104d' are formed, the semiconductor nanostructures 104b'-104d' remain being held by the epitaxial structures 138. Therefore, after the removal of the semiconductor layers 102b-102d (that function as sacrificial layers), the released semiconductor nanostructures 104b'-104d' are prevented from falling down.

During the removal of the semiconductor layers 102b-102d (that function as sacrificial layers), the inner spacers 136 protect the epitaxial structures 138 from being etched or damaged. The quality and reliability of the semiconductor device structure are improved.

During the removal of the semiconductor layers 102b-102d (that function as sacrificial layers), the semiconductor layer 102a (that function as a base layer) is covered and protected by the nanostructure 104a' (that function as a protective layer) and the isolation structure 114, as shown in FIGS. 2F and 3J. As a result, the semiconductor layer 102a is prevented from being etched or damaged.

Figure 2G:
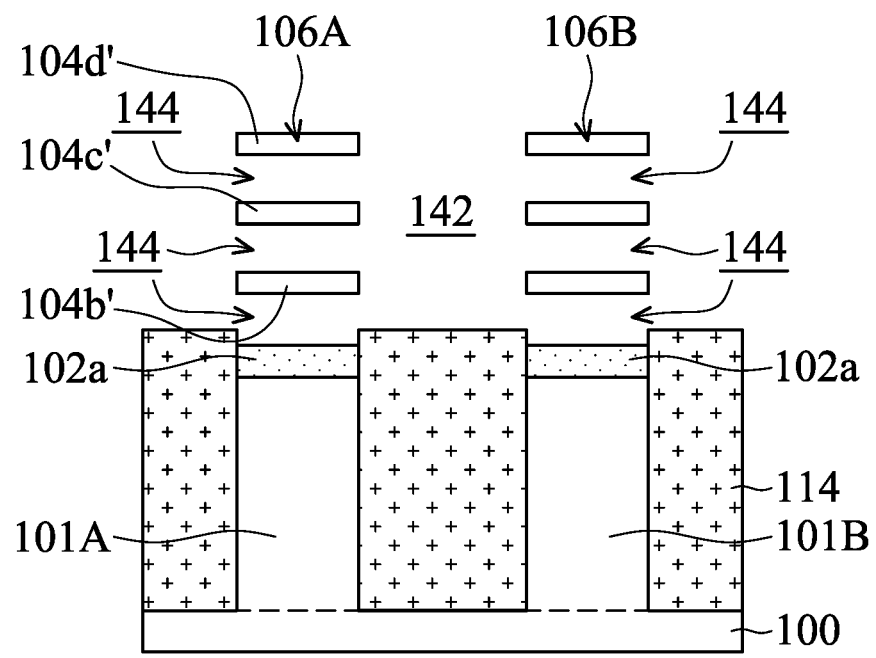
Figure 3K:
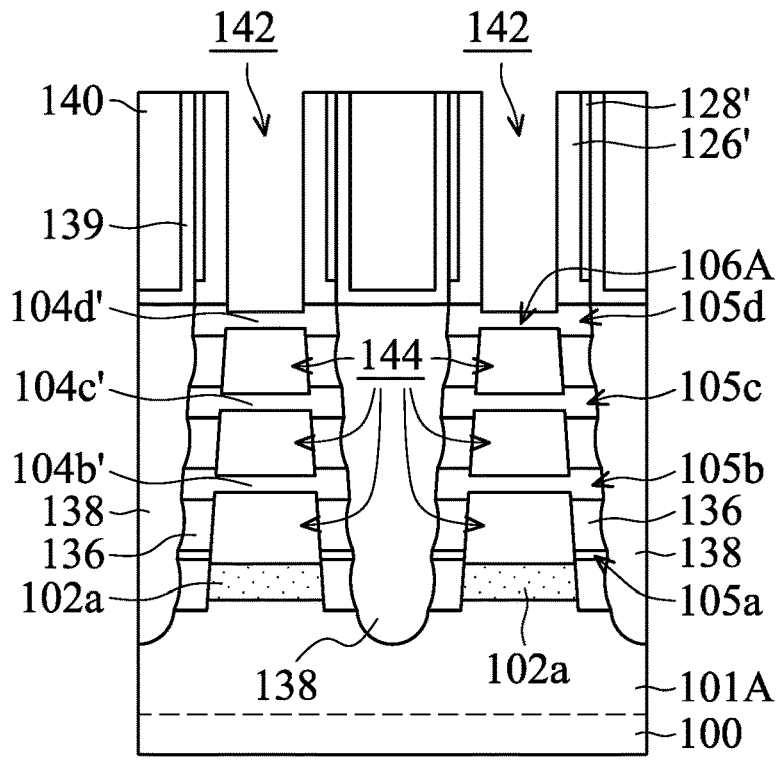

As shown in FIGS. 2G and 3K, the nanostructure 104a' (that function as a protective layer) is partially removed to expose the semiconductor layer 102a (that function as a base layer), in accordance with some embodiments. The nanostructure 104a' may be removed using a dry etching process, a wet etching process, or a combination thereof. The semiconductor nanostructures 104b'-104d' may also be slightly etched during the removal of the nanostructure 104a'.

After the partial removal of the nanostructure 104a', each of the edge elements 105a still remains between two of the inner spacers 136. In some embodiments, each of the remaining edge elements 105a is thinner than each of the semiconductor nanostructures 104b'-104d', as shown in FIG. 3K. In some embodiments, each of the remaining edge elements 105a has a length shorter than the length of each of the semiconductor nanostructures 104b'-104d', as shown in FIG. 3K.

As mentioned above, in some embodiments as illustrated in FIG. 2A, the ratio ($T_1/T_2$) of the thickness $T_1$ of the semiconductor layer 104a (that afterwards functions as a protective layer to the semiconductor layer 102a) to the thickness $T_2$ of the semiconductor layer 104b (that afterwards becomes the nanostructure 104b') may be in a range from about 2/5 to about 2/3. In some cases, if the thickness ratio ($T_1/T_2$) is lower than about 2/5, the semiconductor layer 104a with the thickness $T_1$ may be too thin. As a result, during the removal of the semiconductor layers 102b-102d (that function as sacrificial layers) as illustrated in FIGS. 2F and 3J, the semiconductor layer 104a might be completely removed or broken such that the semiconductor layer 102a thereunder is exposed to the etchant. The semiconductor layer 102a may be damaged. In some other cases, if the thickness ratio ($T_1/T_2$) is greater than about 2/3, the semiconductor layer 104a with the thickness $T_1$ may be too thick. As a result, during the partial removal of the nanostructure 104a' (that function as a protective layer) for exposing the semiconductor layer 102a as illustrated in FIGS. 2G and 3K, the semiconductor nanostructures 104b'-104d' may be consumed too much since a heavier etching process might be used for the partial removal of the thick nanostructure 104a'. The performance of the semiconductor device structure might be negatively affected.

Figure 2H:
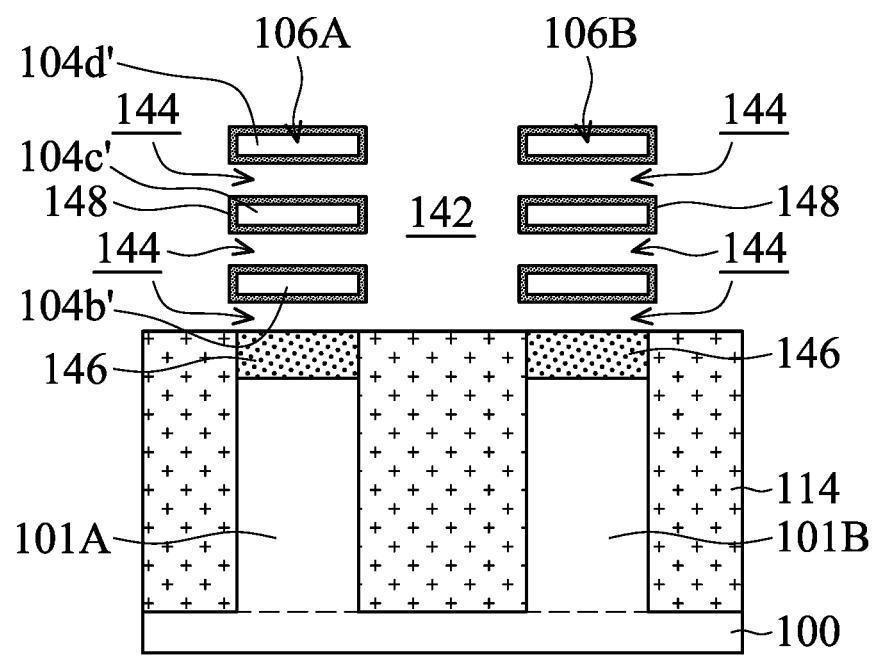
Figure 3L:
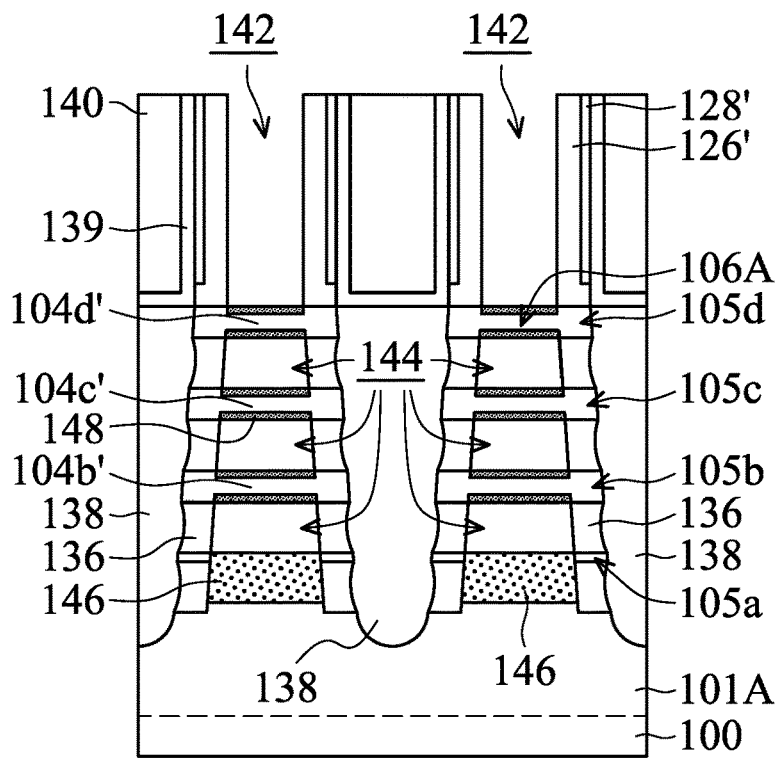

As shown in FIGS. 2H and 3L, the semiconductor layer 102a (that functions as a base layer) is transformed into stressor structures 146, in accordance with some embodiments. In some embodiments, the entirety of the semiconductor layer 102a is transformed into the stressor structures 146. As shown in FIG. 2H, the stressor structures 146 are surrounded by the isolation structure 114. In some embodiments, one of the inner spacers 136 (such as the bottommost inner spacer 136) is in direct contact with the stressor structure 146 and the epitaxial structure 138 nearby, as shown in FIG. 3L.

In some embodiments, the stressor structures 146 are formed by oxidizing the semiconductor layer 102a. A thermal operation may be used to form the stressor structures 146. The thermal operation may be performed at a temperature that is in a range from about 400 degrees C. to about 850 degrees C. The thermal operation time may be in a range from about 0.5 hours to about 4 hours. The thermal operation may be performed under an oxygen-containing atmosphere. The oxygen-containing atmosphere may include oxygen gas or a gas mixture including oxygen gas and hydrogen gas.

After the thermal operation, the semiconductor layer 102a may "expand" and transformed into the stressor structures 146 that is made of a semiconductor oxide material. The stressor structures 146 may contain oxygen and a semiconductor material that is other than silicon (such as germanium). The stressor structures 146 may be made of or include silicon germanium oxide, germanium oxide, one or more other suitable materials, or a combination thereof. In some embodiments, each of the stressor structures 146 becomes thicker than the original semiconductor layer 102a that has not yet been transformed into the stressor structures 146. In some embodiments, the top surface of the stressor structure 146 is at a higher level than that of the semiconductor layer 102a. In some embodiments, the top surface of the stressor structure 146 is substantially as high as the top surface of the edge element 105a.

Due to the expansion occurred during the transformation from the semiconductor layer 102a to the stressor structures 146, compressive stress may be applied from the stressor structures 146 to the epitaxial structures 138 such that the epitaxial structures 138 might be slightly pushed away. In response, tensile stress may be applied from the epitaxial structures 138 to the semiconductor nanostructures 104b'-104d' that function as channel structures. As a result, the electron carrier mobility may be increased. The performance of the semiconductor device structure is thus significantly improved. In some embodiments, the semiconductor nanostructures 104b'-104d' function as channel structures of an n-type MOSFET.

During the thermal operation for forming the stressor structures 146, surface portions of the semiconductor nanostructures 104b'-104d' may also be oxidized to form oxide elements 148, as shown in FIGS. 2H and 3L in accordance with some embodiments. The oxide elements 148 may be made of a material that is different than that of the stressor structures 146. The oxide elements 148 may be made of or include silicon oxide, germanium oxide, one or more other suitable materials, or a combination thereof.

Figure 2I:
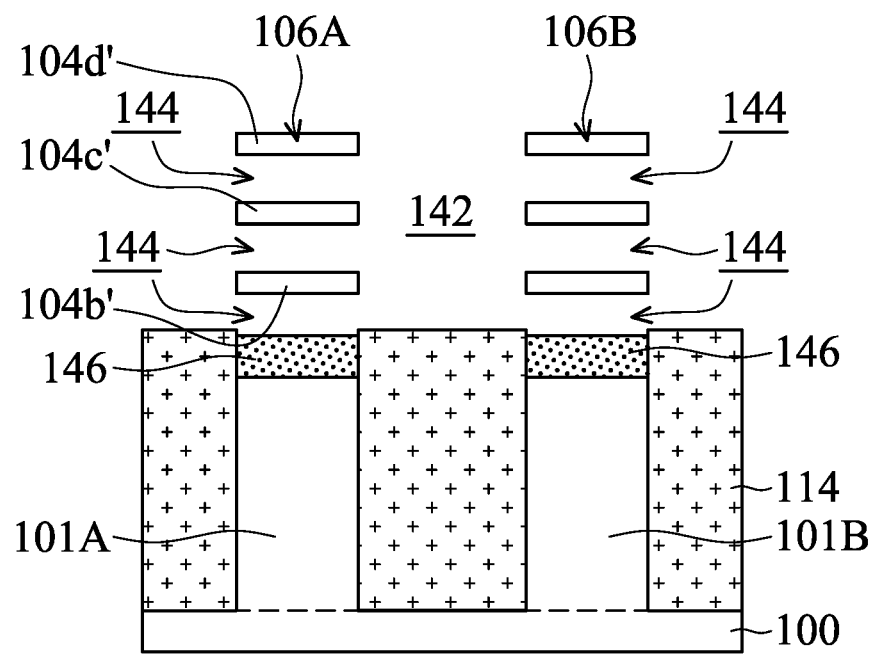
Figure 3M:
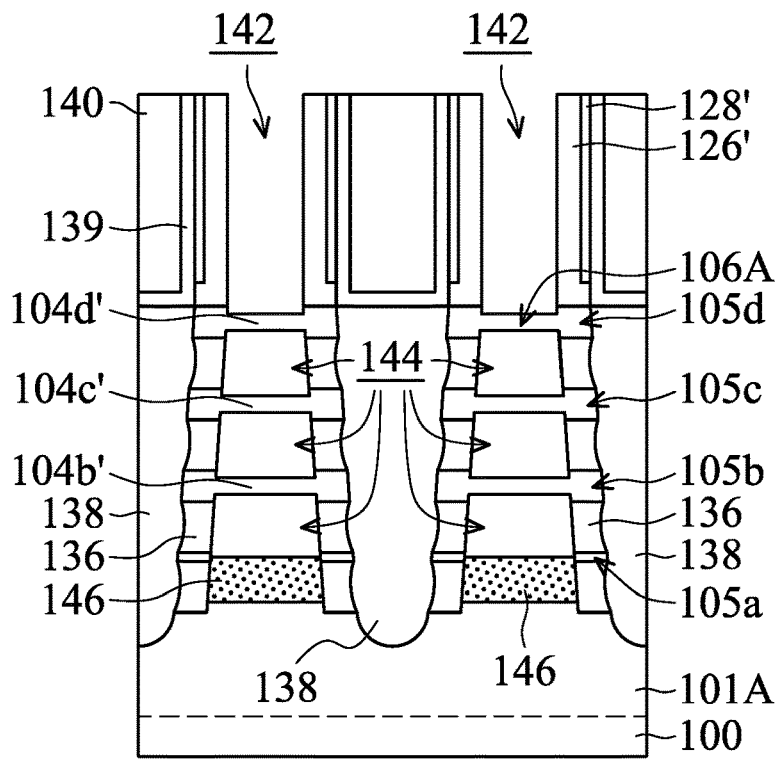
Figure 3N:
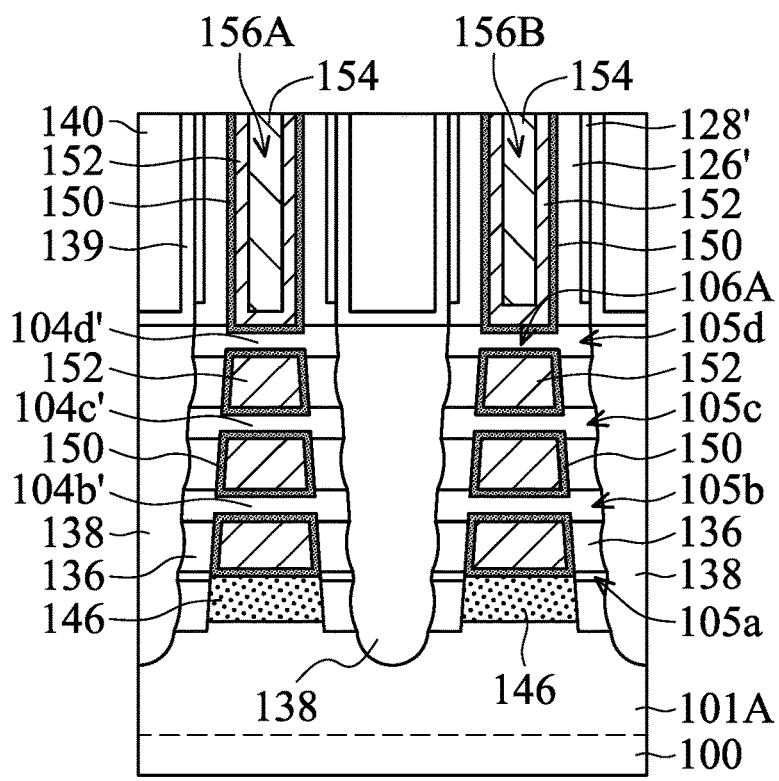

As shown in FIGS. 2I and 3M, the oxide elements 148 are removed, in accordance with some embodiments. After the removal of the oxide elements 148, the semiconductor nanostructures 104b'-104d' may become thinner. The oxide elements 148 may be removed using an etching process. The etching process may also partially remove the stressor structures 146. As a result, the top surfaces of the stressor structures 146 are at a height level that is between the top surfaces and the bottom surfaces of the edge elements 105a, as shown in FIG. 3M in accordance with some embodiments. In some embodiments, the top surfaces of the stressor structures 146 are at a height level that is lower than the top surface of the isolation structure 114, as shown in FIG. 2I. The stressor structure 146 may have a thickness that is in a range from about 10 nm to about 40 nm.

Figure 2J:
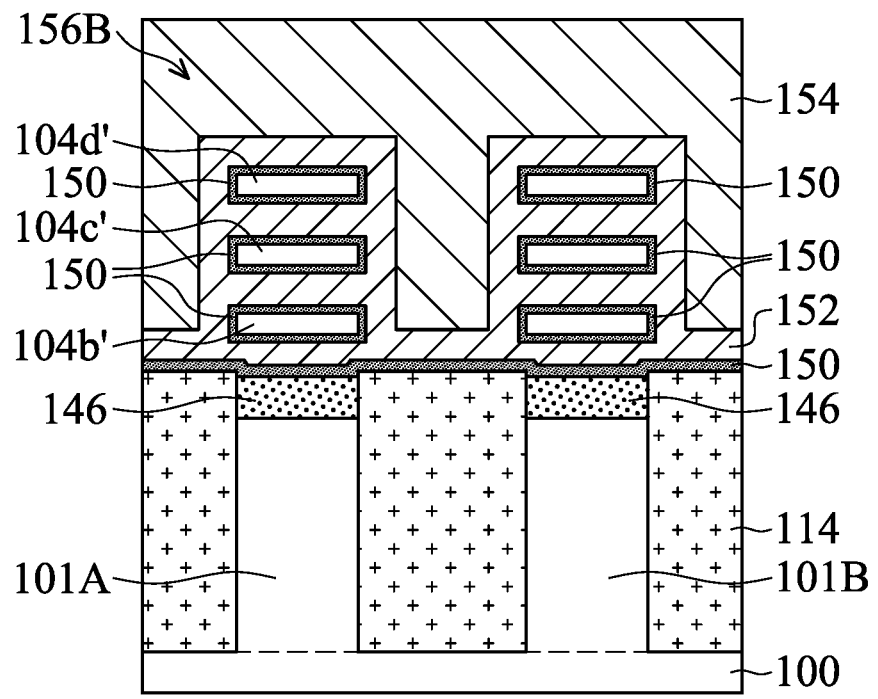

As shown in FIGS. 2J and 3N, metal gate stacks 156A and 156B are formed to fill the trenches 142, in accordance with some embodiments. The metal gate stacks 156A and 156B extend into the recesses 144 to wrap around each of the semiconductor nanostructures 104b'-104d'. In some embodiments, each of the stressor structures 146 is in direct contact with the corresponding semiconductor fin 101A or 101B, the isolation structure 114, and the corresponding metal gate stack 156A or 156B, as shown in FIGS. 2J and 3N.

Each of the metal gate stacks 156A and 156B includes multiple metal gate stack layers. Each of the metal gate stacks 156A and 156B may include a gate dielectric layer 150, a work function layer 152, and a conductive filling 154. In some embodiments, the formation of the metal gate stacks 156A and 156B involves the deposition of multiple metal gate stack layers over the dielectric layer 140 to fill the trenches 142. The metal gate stack layers extend into the recesses 144 to wrap around each of the semiconductor nanostructures 104b'-104d'.

In some embodiments, the gate dielectric layer 150 is made of or includes a dielectric material with high dielectric constant (high-K). The gate dielectric layer 150 may be made of or include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, one or more other suitable high-K materials, or a combination thereof. The gate dielectric layer 150 may be deposited using an ALD process, a CVD process, one or more other applicable processes, or a combination thereof.

In some embodiments, before the formation of the gate dielectric layer 150, an interfacial layers are formed on the surfaces of the semiconductor nanostructures 104b'-104d'. The interfacial layers are very thin and are made of, for example, silicon oxide or germanium oxide. In some embodiments, the interfacial layers are formed by applying an oxidizing agent on the surfaces of the semiconductor nanostructures 104b'-104d'. For example, a hydrogen peroxide-containing liquid may be applied or provided on the surfaces of the semiconductor nanostructures 104b'-104d' so as to form the interfacial layers.

The work function layer 152 may be used to provide the desired work function for transistors to enhance device performance including improved threshold voltage. In some embodiments, the work function layer 152 is used for forming an NMOS device. The work function layer 152 is an n-type work function layer. The n-type work function layer is capable of providing a work function value suitable for the device, such as equal to or less than about 4.5 eV.

The n-type work function layer may include metal, metal carbide, metal nitride, or a combination thereof. For example, the n-type work function layer includes titanium nitride, tantalum, tantalum nitride, one or more other suitable materials, or a combination thereof. In some embodiments, the n-type work function is an aluminum-containing layer. The aluminum-containing layer may be made of or include TiAlC, TiAlO, TiAlN, one or more other suitable materials, or a combination thereof.

The work function layer 152 may also be made of or include hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combinations thereof. The thickness and/or the compositions of the work function layer 152 may be fine-tuned to adjust the work function level.

The work function layer 152 may be deposited over the gate dielectric layer 150 using an ALD process, a CVD process, a PVD process, an electroplating process, an electroless plating process, one or more other applicable processes, or a combination thereof.

In some embodiments, a barrier layer is formed before the work function layer 152 to interface the gate dielectric layer 150 with the subsequently formed work function layer 152. The barrier layer may also be used to prevent diffusion between the gate dielectric layer 150 and the subsequently formed work function layer 152. The barrier layer may be made of or include a metal-containing material. The metal-containing material may include titanium nitride, tantalum nitride, one or more other suitable materials, or a combination thereof. The barrier layer may be deposited using an ALD process, a CVD process, a PVD process, an electroplating process, an electroless plating process, one or more other applicable processes, or a combination thereof.

In some embodiments, the conductive filling 154 are made of or include a metal material. The metal material may include tungsten, aluminum, copper, cobalt, one or more other suitable materials, or a combination thereof. A conductive layer used for forming the conductive filling 154 may be deposited over the work function layer 152 using a CVD process, an ALD process, a PVD process, an electroplating process, an electroless plating process, a spin coating process, one or more other applicable processes, or a combination thereof.

In some embodiments, a blocking layer is formed over the work function layer 152 before the formation of the conductive layer used for forming the conductive filling 154. The blocking layer may be used to prevent the subsequently formed conductive layer from diffusing or penetrating into the work function layer 152. The blocking layer may be made of or include tantalum nitride, titanium nitride, one or more other suitable materials, or a combination thereof. The blocking layer may be deposited using an ALD process, a PVD process, an electroplating process, an electroless plating process, one or more other applicable processes, or a combination thereof.

Afterwards, a planarization process is performed to remove the portions of the metal gate stack layers outside of the trenches 142, in accordance with some embodiments. As a result, the remaining portions of the metal gate stack layers form the metal gate stacks 156A and 156B, as shown in FIGS. 2J and 3N. In some embodiments, the conductive filling 154 does not extend into the recesses 144 since the recesses 144 are small and have been filled with other elements such as the gate dielectric layer 150 and the work function layer 152. However, embodiments of the disclosure are not limited thereto. In some other embodiments, a portion of the conductive filling 154 extends into the recesses 144, especially for the lower recesses 144 that may have larger space.

In some embodiments, the epitaxial structures 138 extend exceeding the top surfaces of the stressor structures 146. In some embodiments, the epitaxial structures 138 extend exceeding the interface between the stressor structures 146 and the metal gate stack 156A or 156B. In some embodiments, the epitaxial structures 138 further extend exceeding the bottom surfaces of the stressor structures 146. Therefore, the stressor structures 146 may apply compressive stress on the epitaxial structures 138 easier. The epitaxial structures 138 may thus accordingly apply tensile stress on the semiconductor nanostructures $104b'$-$104d'$ that may function as channel structures. The performance of the semiconductor device structure is significantly improved.

In some embodiments, the top surface of the stressor structure 146 is between the top surface and the bottom surface of the edge element 105a, as shown in FIG. 3N. However, embodiments of the disclosure are not limited thereto. Many variations and/or modifications can be made to embodiments of the disclosure.

Figure 4A:
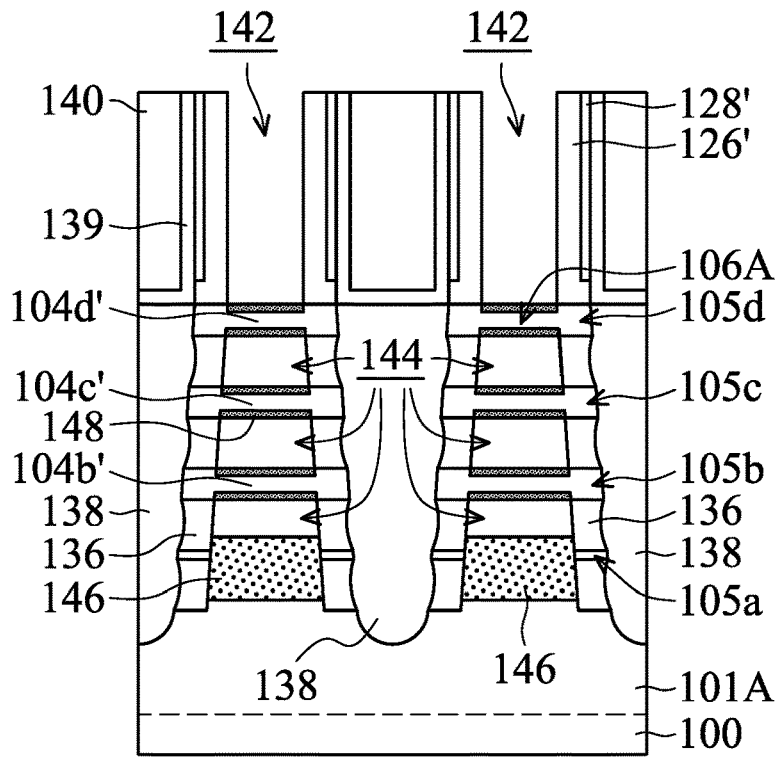
FIGS. 4A-4B are cross-sectional views of various stages of a process for forming a semiconductor device structure, in accordance with some embodiments.
Figure 4B:
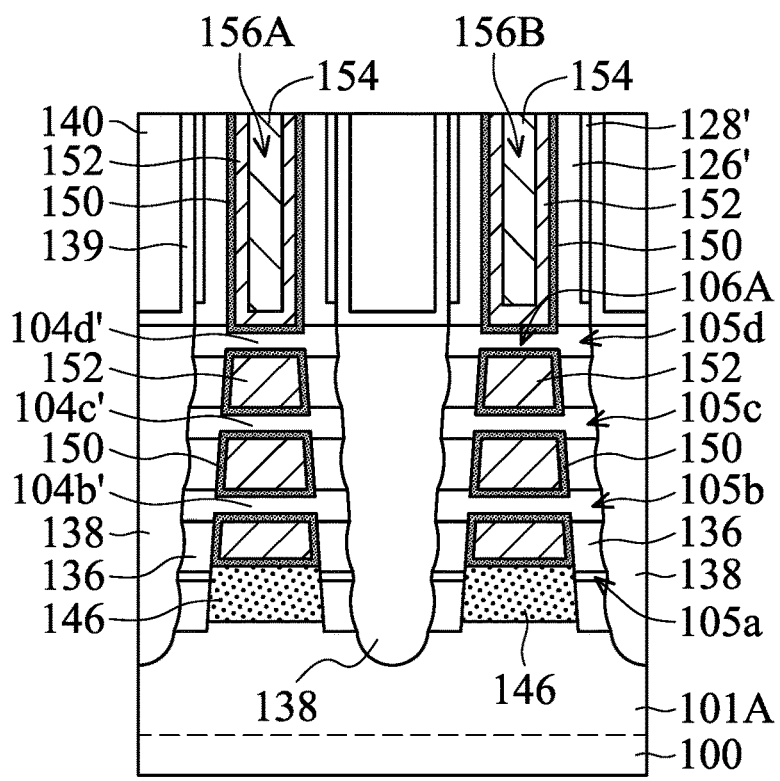

FIGS. 4A-4B are cross-sectional views of various stages of a process for forming a semiconductor device structure, in accordance with some embodiments. As shown in FIG. 4A, a structure similar to that shown in FIG. 3L is formed or received. In some embodiments, the stressor structures 146 expand to exceed the top surfaces of the edge elements 105a, as shown in FIG. 4A. Afterwards, processes similar to those illustrated in FIGS. 3M-3N are performed. As a result, the semiconductor device structure as shown in FIG. 4B is formed, in accordance with some embodiments. As shown in FIG. 4B, the top surfaces of the stressor structures 146 are higher than the top surfaces of the edge elements 105a.

Figure 5:
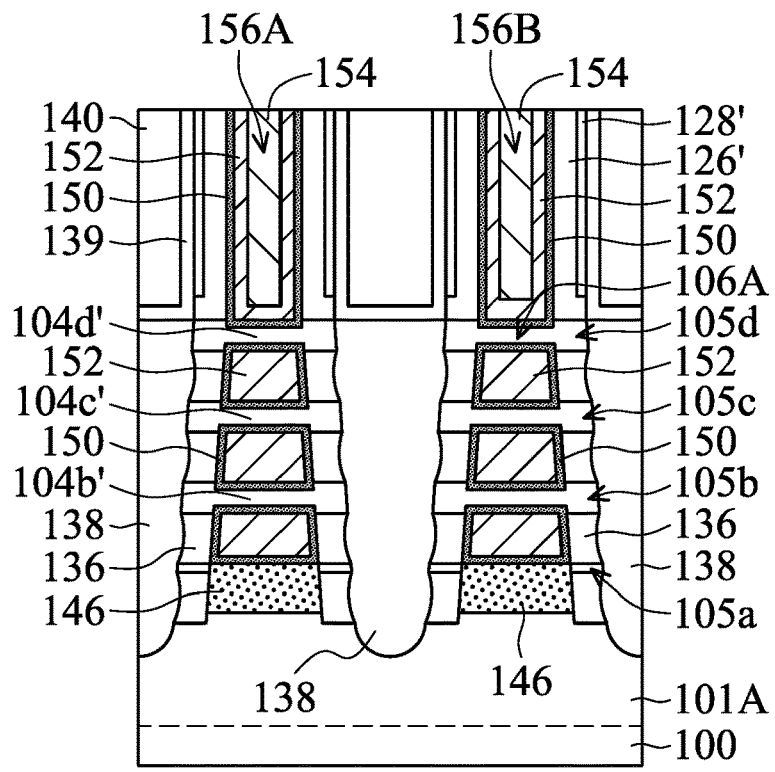
FIG. 5 is a cross-sectional view of a semiconductor device structure, in accordance with some embodiments.

Many variations and/or modifications can be made to embodiments of the disclosure. FIG. 5 is a cross-sectional view of a semiconductor device structure, in accordance with some embodiments. In some embodiments, the top surfaces of the stressor structures 146 are substantially level with the top surfaces of the edge elements 105a.

Figure 6:
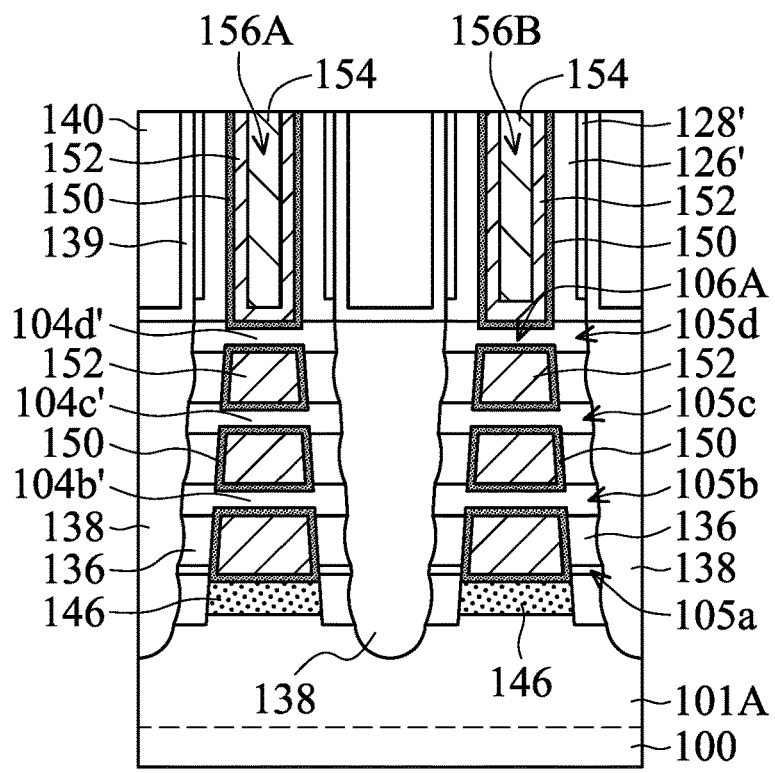
FIG. 6 is a cross-sectional view of a semiconductor device structure, in accordance with some embodiments.

Many variations and/or modifications can be made to embodiments of the disclosure. FIG. 6 is a cross-sectional view of a semiconductor device structure, in accordance with some embodiments. In some embodiments, the top surfaces of the stressor structures 146 are lower than the bottom surfaces of the edge elements 105a.

In some embodiments, each of the edge elements 105a is sandwiched between two of the inner spacers 136. In some embodiments, each of the edge elements 105a does not connect to a channel structure, as shown in FIG. 3N. Each of the edge elements 105a is thinner than the edge element 105b, 105c, or 105d.

However, embodiments of the disclosure are not limited thereto. Many variations and/or modifications can be made to embodiments of the disclosure. In some other embodiments, the semiconductor device structure does not include the edge elements 105a.

Figure 7A:
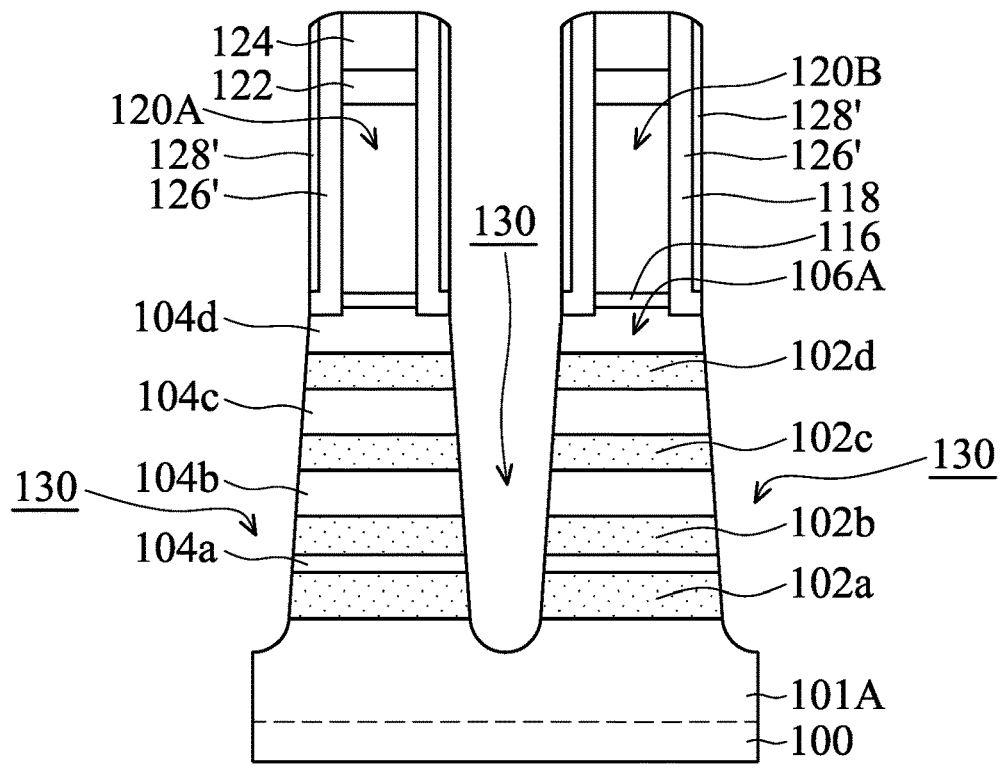
FIGS. 7A-7C are cross-sectional views of various stages of a process for forming a semiconductor device structure, in accordance with some embodiments.
Figure 7B:
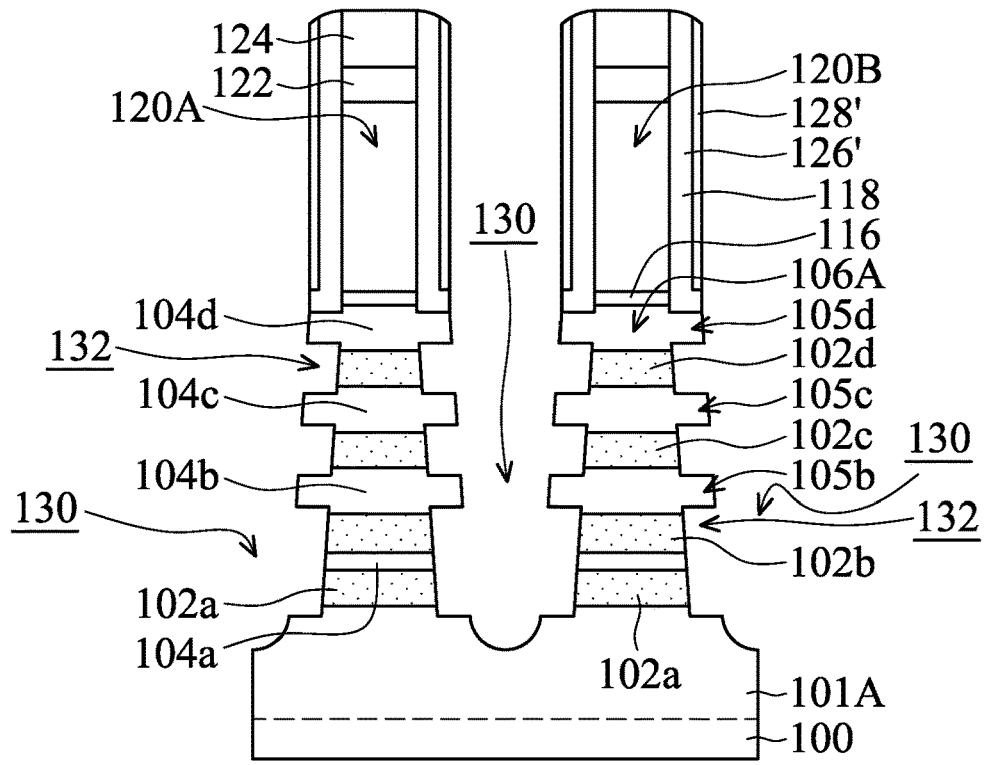
Figure 7C:
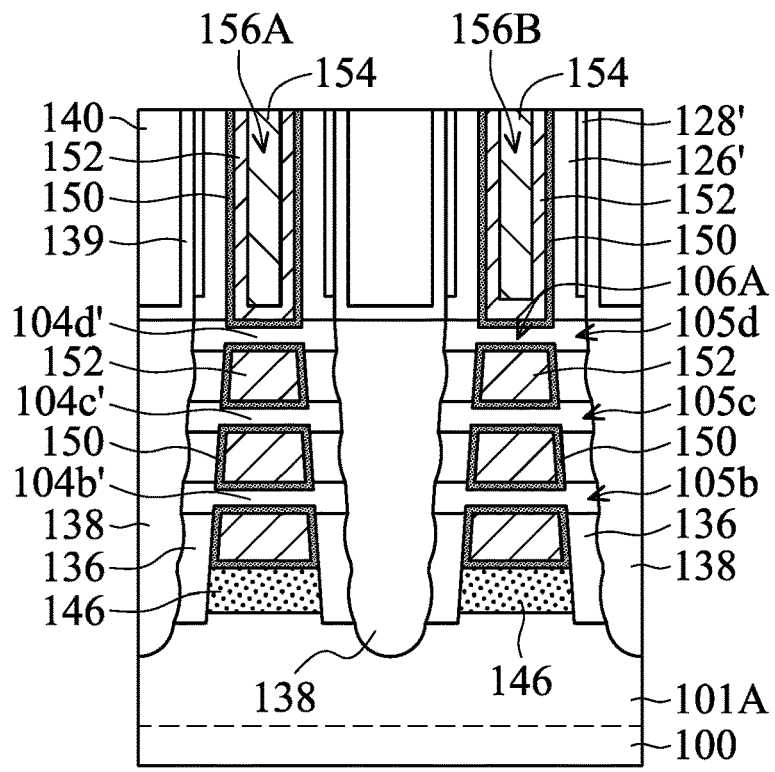

FIGS. 7A-7C are cross-sectional views of various stages of a process for forming a semiconductor device structure, in accordance with some embodiments. A shown in FIG. 7A, a structure the same as or similar to the structure shown in FIG. 3C is formed or received.

As shown in FIG. 7B, a process the same as or similar to the process illustrated in FIG. 3D is performed to laterally etch the semiconductor layers 102a-102d so as to form the recesses 132, in accordance with some embodiments. As mentioned above, during the lateral etch of the semiconductor layers 102a-102d, edge portions of the semiconductor layer 104a may also be etched. In some embodiments, the semiconductor layer 104a is very thin. As a result, the edge portions of the semiconductor layer 104a are completely removed (or consumed) during the lateral etching of the semiconductor layers 102a-102d. No edge portions of the semiconductor layer 104 protrude from the sidewalls of the semiconductor layers 102a and 102b to form edge elements. Comparing the embodiments shown in FIGS. 7B and 3D, one of the differences is that the embodiments illustrated in FIG. 7B do not have the edge elements 105a.

Afterwards, the processes the same as or similar to those illustrated in FIGS. 3E-3N are performed. As a result, the structure shown in FIG. 7C is formed, in accordance with some embodiments.

In some embodiments, an entirety of the semiconductor layer 102a is oxidized and transformed into the stressor structures 146, as shown in FIGS. 3K and 3L. However, embodiments of the disclosure are not limited thereto. Many variations and/or modifications can be made to embodiments of the disclosure. In some other embodiments, the semiconductor layer 102a is partially oxidized and/or transformed into the stressor structures 146. In some embodiments, an upper portion of the semiconductor layer 102a is oxidized and/or transformed into the stressor structure 146 while a lower portion of the semiconductor layer 102a remains without being oxidized and/or transformed.

Figure 8A:
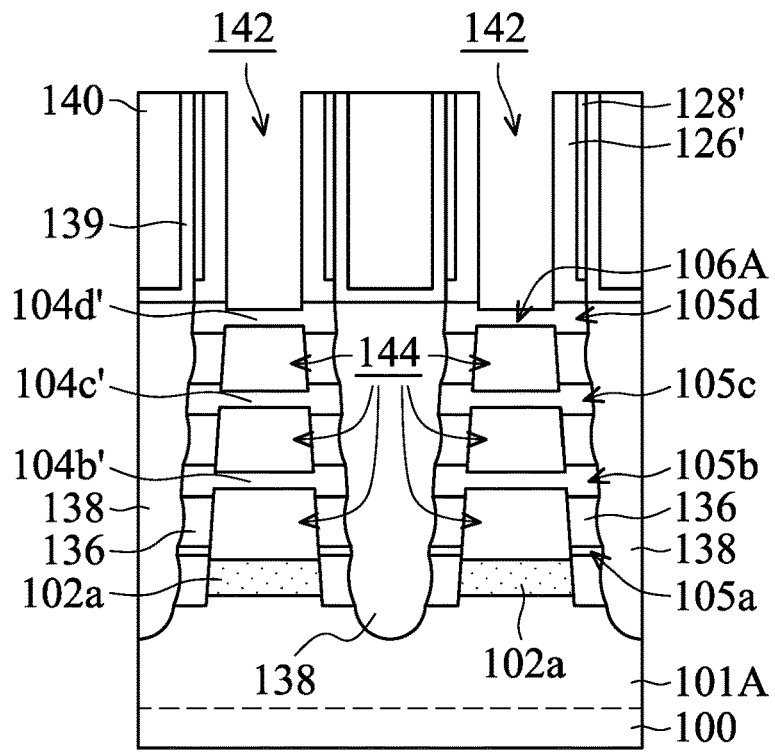
FIGS. 8A-8C are cross-sectional views of various stages of a process for forming a semiconductor device structure, in accordance with some embodiments.
Figure 8B:
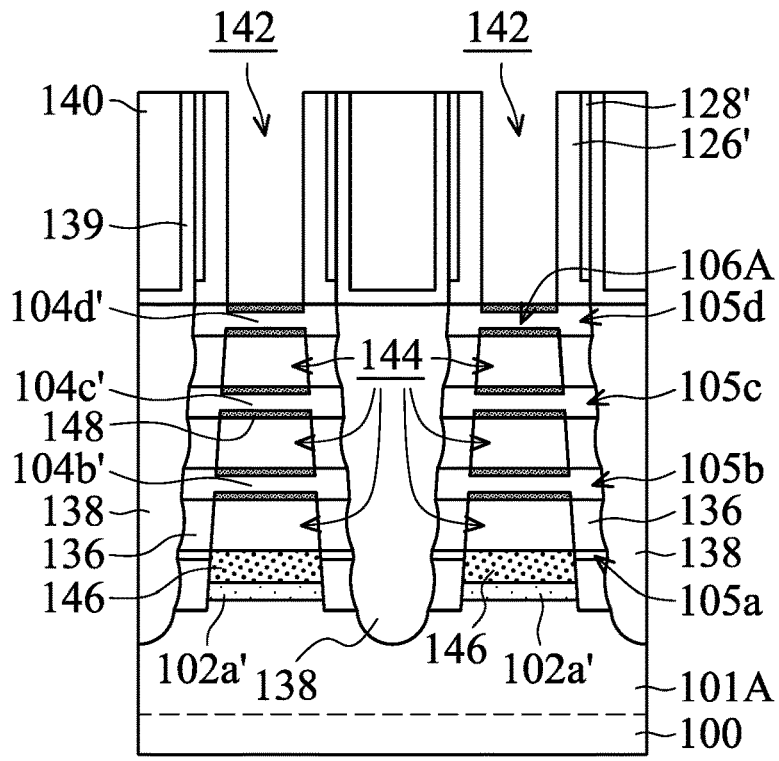
Figure 8C:
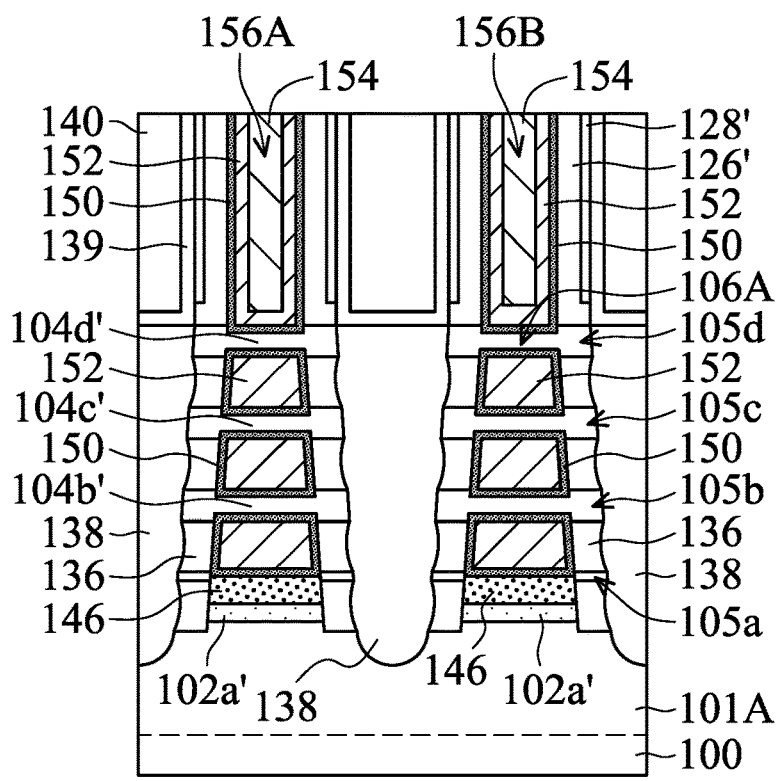

FIGS. 8A-8C are cross-sectional views of various stages of a process for forming a semiconductor device structure, in accordance with some embodiments. As shown in FIG. 8A, a structure the same as or similar to the structure shown in FIG. 3K is formed or received.

Afterwards, similar to the process illustrated in FIG. 3L, the semiconductor layer 102a is oxidized, as shown in FIG. 8B in accordance with some embodiments. In some embodiments, the upper portions of the semiconductor layer 102a are oxidized and/or transformed into the stressor structures 146. The lower portions of the semiconductor layer 102a are not oxidized and/or transformed into the stressor structures 146. The partial oxidation of the semiconductor layer 102a may be fine-tuned by adjusting the thermal operation temperature, the thermal operation time, and/or the thermal operation atmosphere. The lower portions of the semiconductor layer 102a, that remain without being oxidized, form semiconductor elements 102a', as shown in FIG. 8B. In some embodiments, each of the semiconductor elements 102a' is in direct contact with the corresponding stressor structure 146 thereon. In some embodiments, the interface between one of the semiconductor elements 102a' and one of the stressor structures 146 is substantially planar. The semiconductor element 102a' may have a thickness that is in a range from about 2 nm to about 20 nm. The stressor structure 146 thereon may have a thickness that is in a range from about 5 nm to about 20 nm.

Afterwards, the processes the same as or similar to those illustrated in FIGS. 3M-3N are performed. As a result, the structure shown in FIG. 8C is formed, in accordance with some embodiments.

Figure 9:
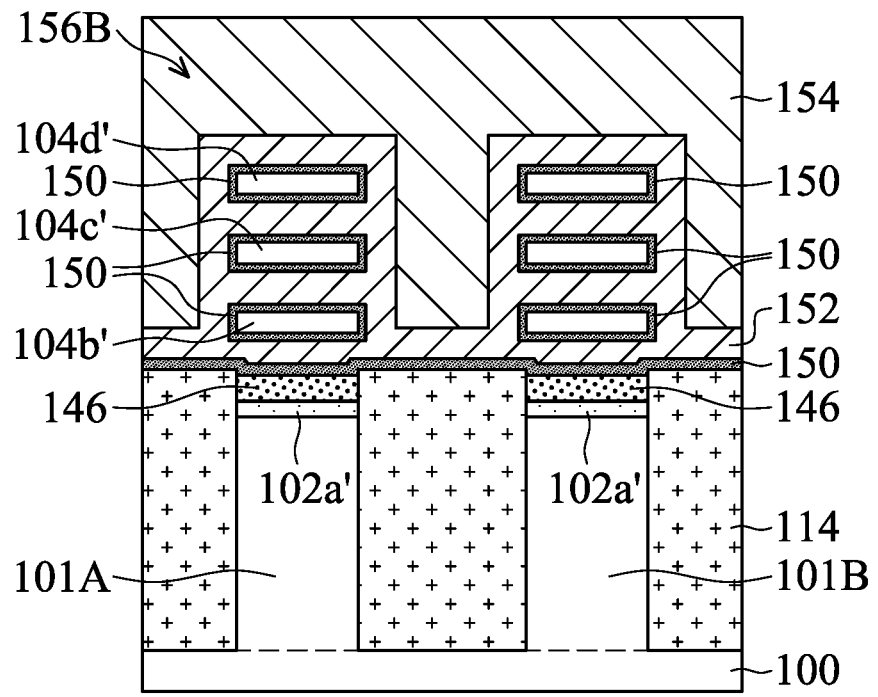
FIG. 9 is a cross-sectional view of a semiconductor device structure, in accordance with some embodiments.

FIG. 9 is a cross-sectional view of a semiconductor device structure, in accordance with some embodiments. In some embodiments, FIG. 9 is another cross-sectional view of the structure shown in FIG. 8C when cut along another direction. In some embodiments, FIG. 9 is the cross-sectional view taken along the longer gate extending direction. In some embodiments, each of the semiconductor elements 102a' is positioned between the corresponding stressor structure 146 thereon and the semiconductor substrate 100, as shown in FIG. 9. In some embodiments, each of the semiconductor elements 102a' is in direct contact with the corresponding stressor structure 146 thereon, the isolation structure 114, and/or the corresponding semiconductor fin 101A or 101B thereunder.

In some embodiments, the interface between each of the stressor structures 146 and the corresponding semiconductor element 102a' thereunder is substantially planar, as shown in FIGS. 8C and 9. However, embodiments of the disclosure are not limited thereto. Many variations and/or modifications can be made to embodiments of the disclosure. In some other embodiments, the interface between each of the stressor structures 146 and the corresponding semiconductor element 102a' thereunder is curved or has curved portions.

Figure 10:
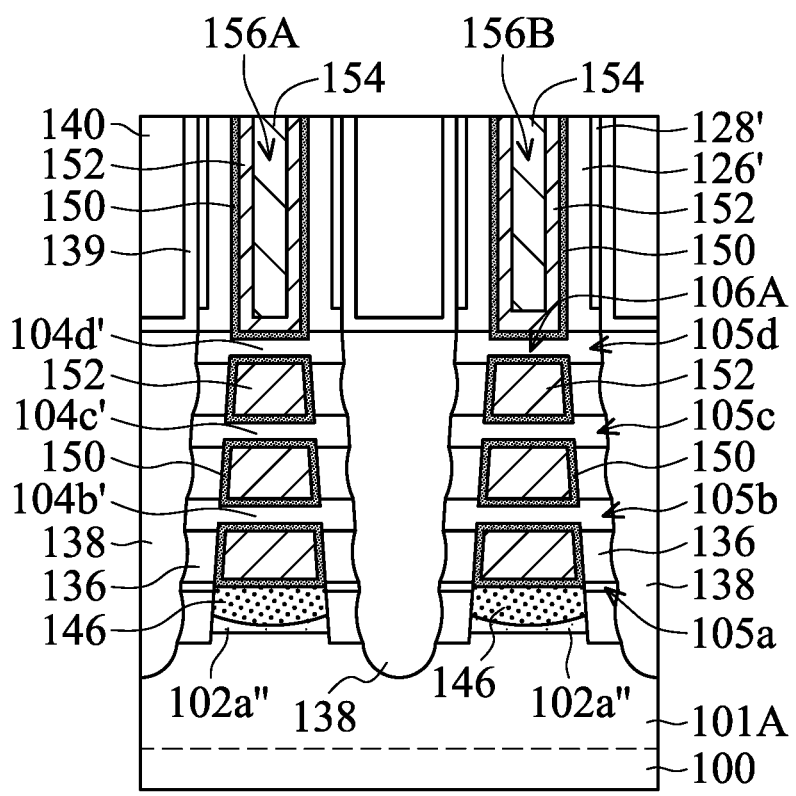
FIG. 10 is a cross-sectional view of a semiconductor device structure, in accordance with some embodiments.

FIG. 10 is a cross-sectional view of a semiconductor device structure, in accordance with some embodiments. The profile of the stressor structures 146 and semiconductor elements 102a" thereunder may be modified by fine-tuning the thermal operation. For example, the thermal operation temperature, the thermal operation time, and/or the thermal operation atmosphere may be adjusted to modify the profile of the stressor structures 146.

In some embodiments, the bottoms of the stressor structures 146 are curved, as shown in FIG. 10. In some embodiments, the interface between the stressor structure 146 and the semiconductor element 102a" thereunder is a convex surface facing the semiconductor element 102a".

Figure 11:
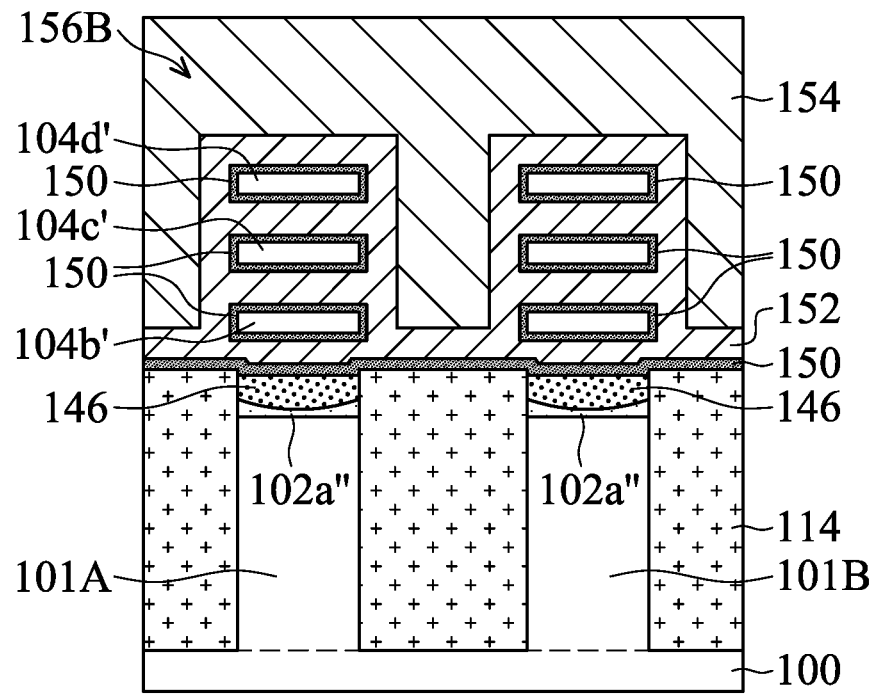
FIG. 11 is a cross-sectional view of a semiconductor device structure, in accordance with some embodiments.

FIG. 11 is a cross-sectional view of a semiconductor device structure, in accordance with some embodiments. In some embodiments, FIG. 11 is another cross-sectional view of the structure shown in FIG. 10 when cut along another direction. In some embodiments, FIG. 11 is the cross-sectional view taken along the longer gate extending direction. In some embodiments, each of the semiconductor elements 102a" is positioned between the corresponding stressor structure 146 thereon and the semiconductor substrate 100, as shown in FIG. 11. In some embodiments, each of the semiconductor elements 102a" is in direct contact with the corresponding stressor structure 146 thereon, the isolation structure 114, and/or the corresponding semiconductor fin 101A or 101B thereunder.

Figure 12:
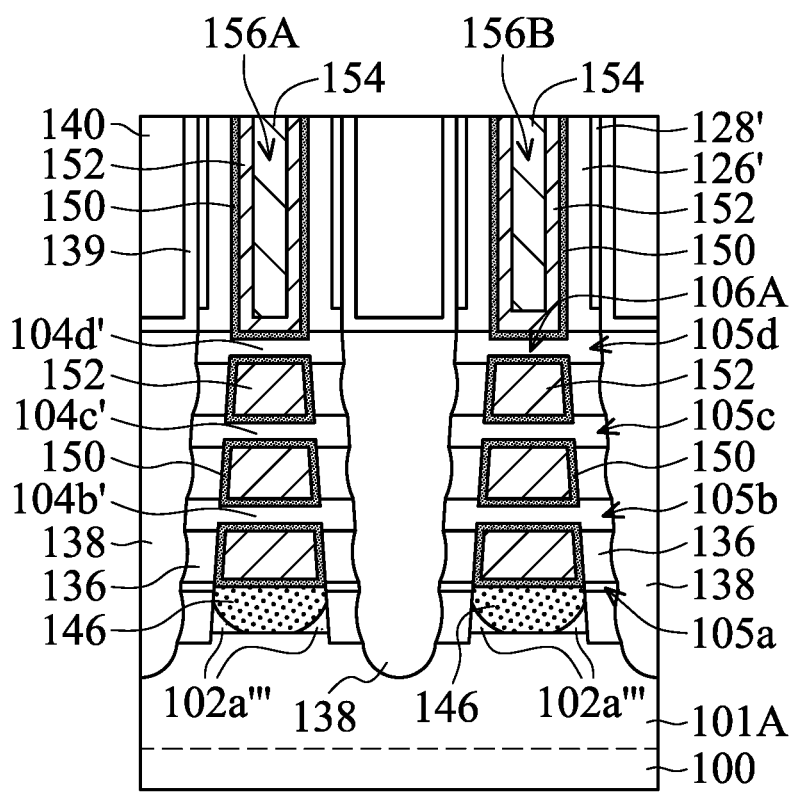
FIG. 12 is a cross-sectional view of a semiconductor device structure, in accordance with some embodiments.
Figure 13:
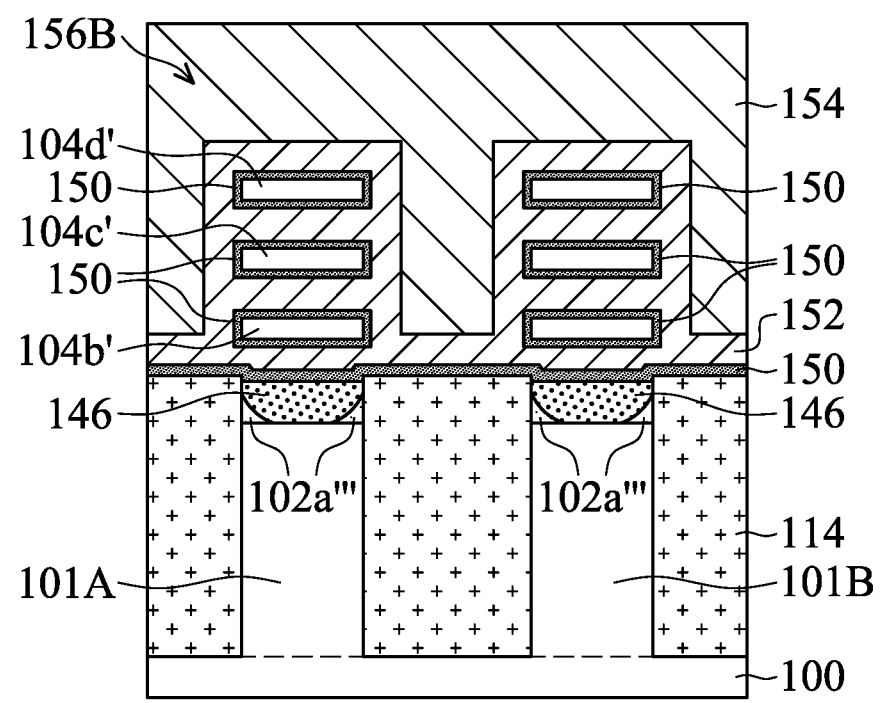
FIG. 13 is a cross-sectional view of a semiconductor device structure, in accordance with some embodiments.

FIG. 12 is a cross-sectional view of a semiconductor device structure, in accordance with some embodiments. FIG. 13 is a cross-sectional view of a semiconductor device structure, in accordance with some embodiments. In some embodiments, FIG. 13 is another cross-sectional view of the structure shown in FIG. 12 when cut along another direction. For example, FIG. 12 shows a "fin cut" cross-sectional view of the semiconductor device structure, and FIG. 13 shows a "gate cut" cross-sectional view of the semiconductor device structure. In some embodiments, there are multiple semiconductor elements 102a'''. Each of the semiconductor elements 102a''' may be surrounded by the corresponding stressor structure 146 and the corresponding inner spacer 136. In some embodiments, the stressor structures 146 are in direct contact with the corresponding semiconductor fin 101A or 101B thereunder, as shown in FIGS. 12 and 13. In some embodiments, the bottom surfaces of the stressor structures 146 and the semiconductor elements 102a''' are substantially level with each other, as shown in FIGS. 12 and 13.

In some embodiments, the bottoms of the epitaxial structures 138 are formed directly on a semiconductor material such as the semiconductor fin 101A or 101B. However, embodiments of the disclosure are not limited thereto. Many variations and/or modifications can be made to embodiments of the disclosure. In some other embodiments, another element that is not made of a semiconductor material is formed between the bottom of the epitaxial structure 138 and the semiconductor substrate 100.

Figure 14A:
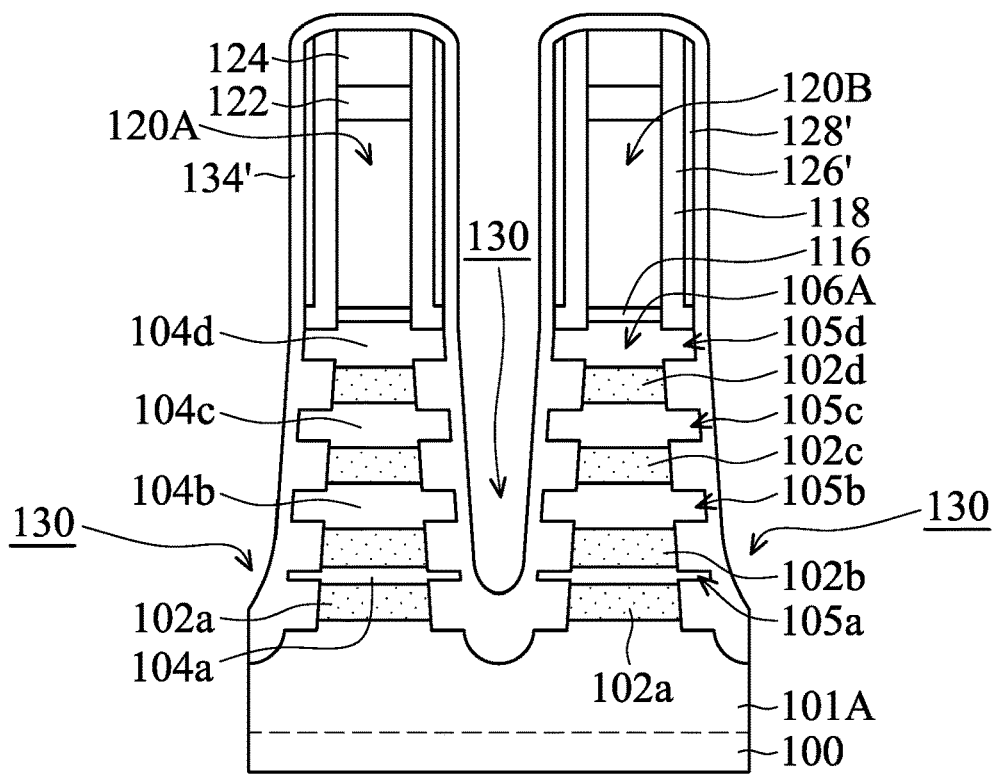
FIGS. 14A-14C are cross-sectional views of various stages of a process for forming a semiconductor device structure, in accordance with some embodiments.
Figure 14B:
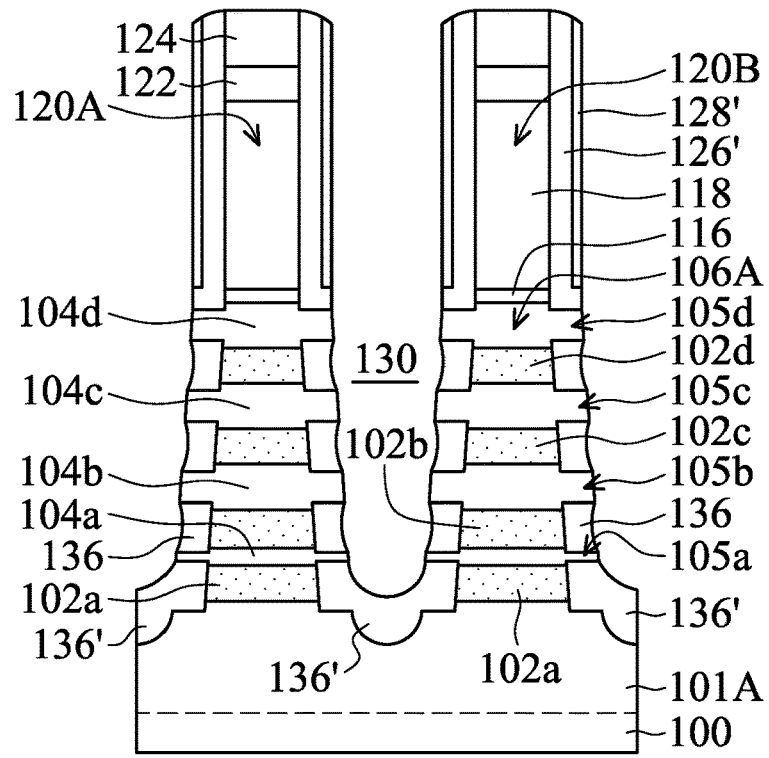
Figure 14C:
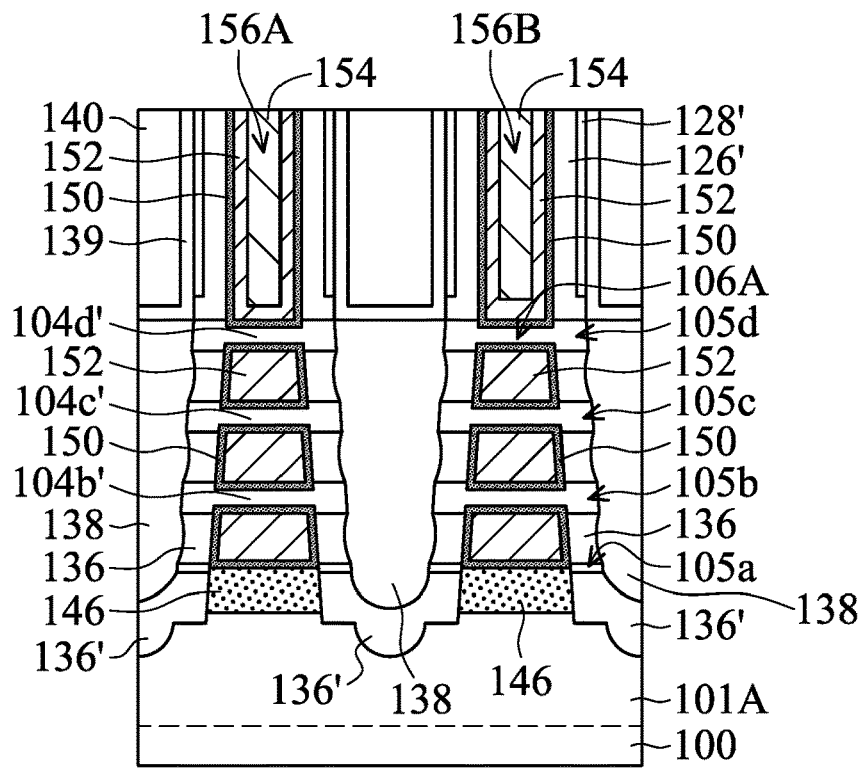

FIGS. 14A-14C are cross-sectional views of various stages of a process for forming a semiconductor device structure, in accordance with some embodiments. As shown in FIG. 14A, a structure the same as or similar to the structure shown in FIG. 3D is formed or received. Afterwards, a spacer layer 134' is deposited, as shown in FIG. 14A, in accordance with some embodiments. The material and formation method of the spacer layer 134' may be the same as or similar to the spacer layer 134 as illustrated in FIG. 3E. In some embodiments, the bottom portions of the spacer layer 134' shown in FIG. 14A is thicker than the bottom portions of the spacer layer 134 shown in FIG. 3E. The profile of the recesses 130 and/or the deposition process of the spacer layer 134' may cause the spacer layer 134' to have thicker bottom portions.

Afterwards, a process the same as or similar to the process illustrated in FIG. 3F is performed. As a result, the structure shown in FIG. 14B is formed, in accordance with some embodiments. As shown in FIG. 14B, similar to FIG. 3F, the inner spacers 136 and bottom inner spacers 136' are formed. In some embodiments, the bottom inner spacers 136' cover the bottom portions of the recesses 130, as shown in FIG. 14B. The portion of one of the bottom inner spacers 136' at the bottom the corresponding recess 130 may have a thickness that is in a range from about 2 nm to about 10 nm.

Afterwards, processes the same as or similar to the processes illustrated in FIGS. 3G-3N are performed. As a result, the structure shown in FIG. 14C is formed, in accordance with some embodiments. The bottom spacers 136' may help to reduce or prevent the current leakage from the epitaxial structures 138. In some embodiments, each of the bottom inner spacers 136' is in direct contact with the corresponding epitaxial structure 138 thereon. In some embodiments, each of the bottom inner spacers 136' surrounds the bottom of the corresponding epitaxial structure 138 thereon such that an entirety of the corresponding epitaxial structure 138 is above the bottom inner spacer 136', as shown in FIG. 14C.

Figure 15:
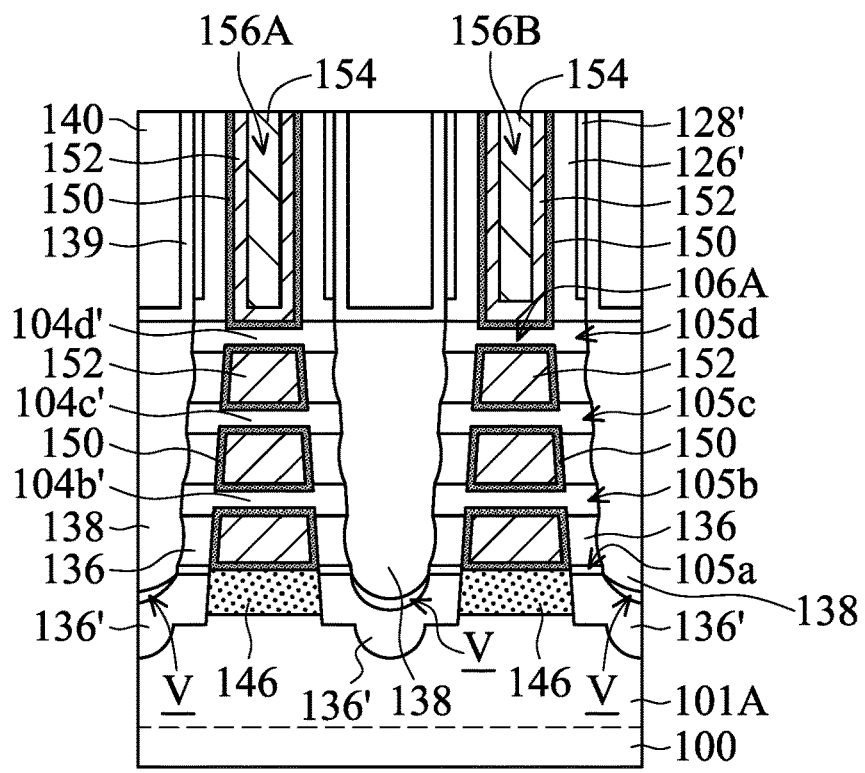
FIG. 15 is a cross-sectional view of a semiconductor device structure, in accordance with some embodiments.

Many variations and/or modifications can be made to embodiments of the disclosure. FIG. 15 is a cross-sectional view of a semiconductor device structure, in accordance with some embodiments. In some embodiments, the epitaxial structures 138 are formed using an epitaxial growth process. In the epitaxial growth process, the semiconductor material may tend to be grown on the surfaces of elements made of a semiconductor material. In the epitaxial growth process, the semiconductor material may tend to be grown on the surfaces of the edge elements 105a-105d. As a result, voids V are formed between the epitaxial structures 138 and the semiconductor substrate 100, as shown in FIG. 15 in accordance with some embodiments.

Figure 16:
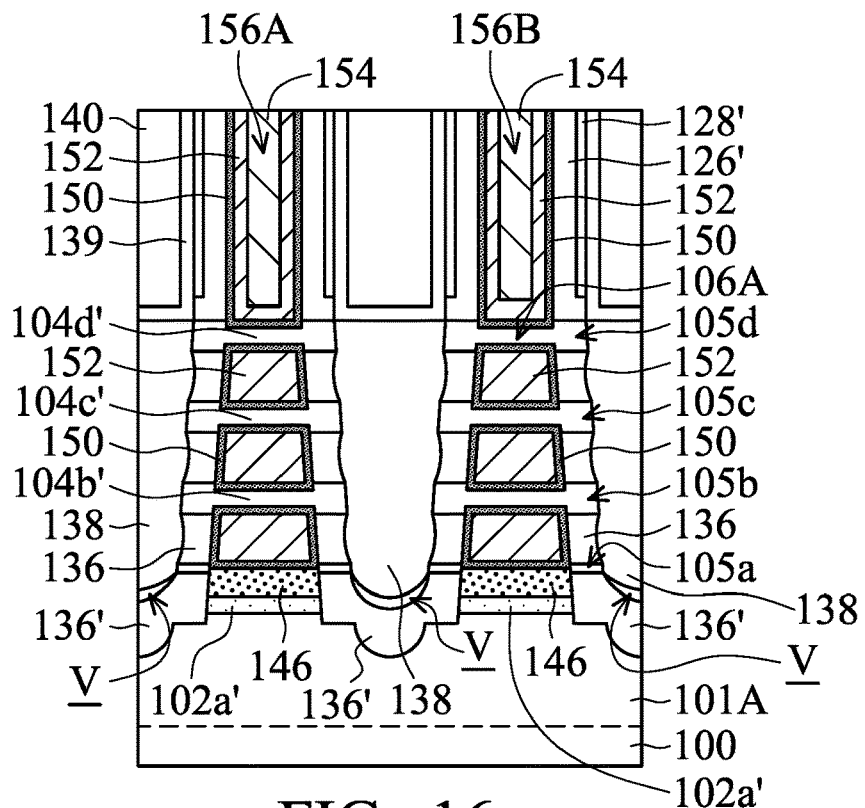
FIG. 16 is a cross-sectional view of a semiconductor device structure, in accordance with some embodiments.

FIG. 16 is a cross-sectional view of a semiconductor device structure, in accordance with some embodiments. A structure similar to the structure shown in FIG. 15 is formed. Similar to the embodiments illustrated in FIGS. 8C, 10, and 12, there are semiconductor elements 102a' remaining without being transformed into the stressor structures 146. In some embodiments, one of the bottom inner spacers 136' is in direct contact with the stressor structures 146 and the semiconductor elements 102a', as shown in FIG. 16.

Figure 17A:
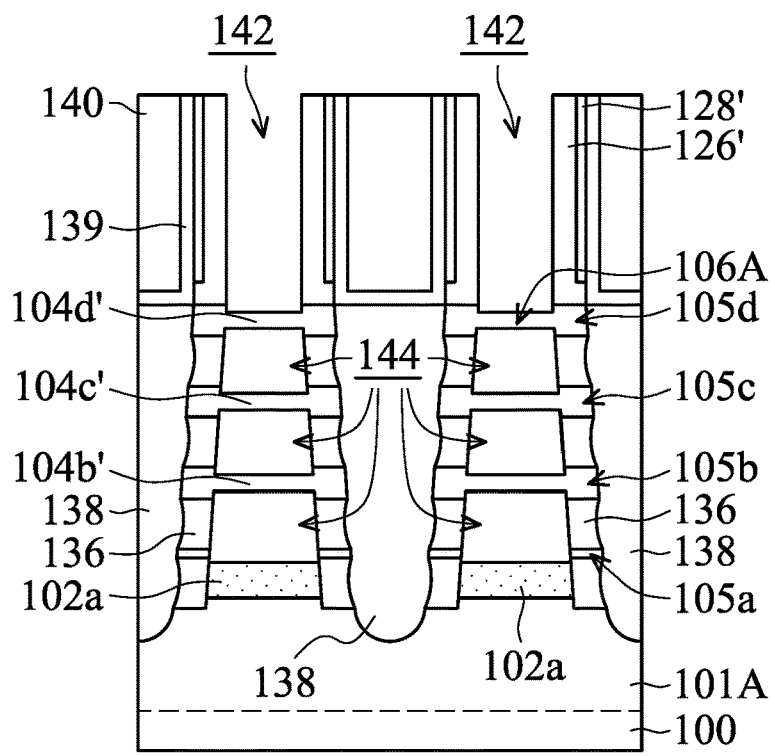
FIGS. 17A-17C are cross-sectional views of various stages of a process for forming a semiconductor device structure, in accordance with some embodiments.
Figure 17B:
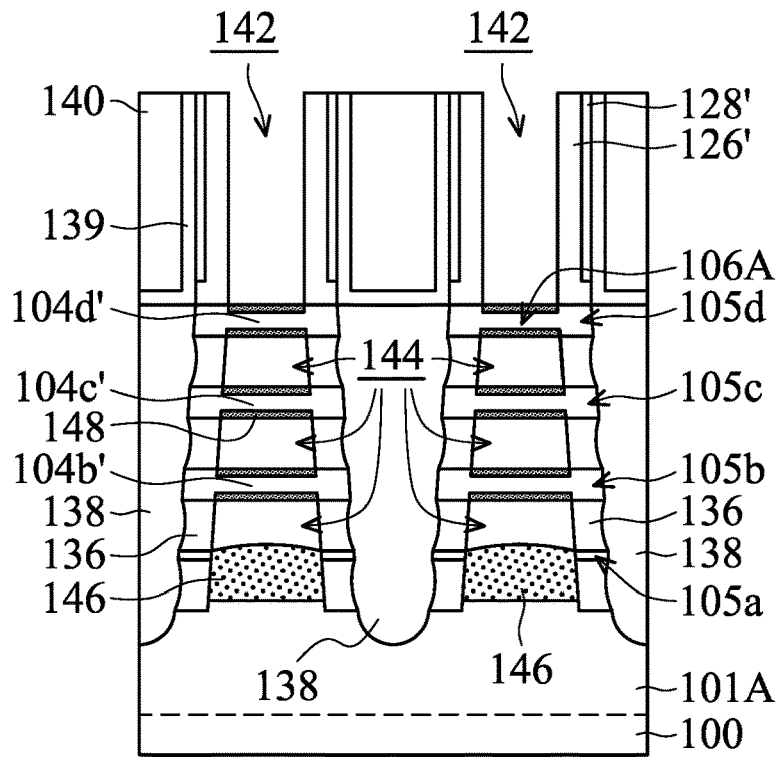
Figure 17C:
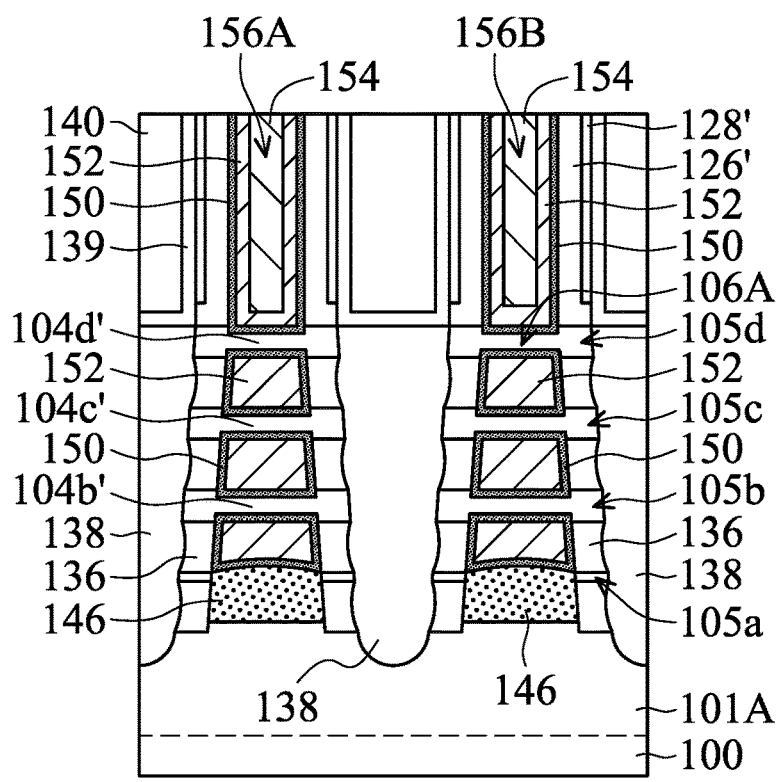

Many variations and/or modifications can be made to embodiments of the disclosure. FIGS. 17A-17C are cross-sectional views of various stages of a process for forming a semiconductor device structure, in accordance with some embodiments. As shown in FIG. 17A, a structure the same as or similar to that shown in FIG. 3K is formed.

Afterwards, similar to the embodiments illustrated in FIG. 3L, the semiconductor layer 102a (that functions as a base layer) is transformed into the stressor structures 146, in accordance with some embodiments. In some embodiments, the semiconductor layer 102a is annealed to form the stressor structures 146. In some embodiments, after the annealing operation, the semiconductor layer 102a expands and is transformed into the stressor structures 146. The top surface of the stressor structures 146 may protrude and have mesa-like profiles. In some embodiments, the stressor structures 146 have curved top surfaces, as shown in FIG. 17B.

Afterwards, the processes the same as or similar to those illustrated in FIGS. 3M-3N are performed, in accordance with some embodiments. As a result, the structure shown in FIG. 17C is formed.

In some embodiments, there are three semiconductor nanostructures 104b'-104d' formed. However, embodiments of the disclosure are not limited thereto. Many variations and/or modifications can be made to embodiments of the disclosure. In some embodiments, the total number of the semiconductor nanostructures is greater than three. In some other embodiments, the total number of the semiconductor nanostructures is smaller than three. The total number of the semiconductor nanostructures (or channel structures) of each semiconductor device structure may be tuned according to the requirement.

Embodiments of the disclosure form a semiconductor device structure with a stressor structure under a channel structure. The channel structure is wrapped around by a gate stack. For example, the semiconductor device structure includes a stack of multiple channel structures that are wrapped around by a metal gate stack. A semiconductor element below the channel structure is transformed into the stressor structure before the formation of the gate stack. The stressor structure may induce epitaxial structures beside the channel structure to apply stress (such as tensile stress) to the channel structure. As a result, the carrier mobility in the channel structure may be improved. The performance and reliability of the semiconductor device structure are greatly improved.

In accordance with some embodiments, a semiconductor device structure is provided. The semiconductor device structure includes multiple semiconductor nanostructures over a substrate and two epitaxial structures over the substrate. Each of the semiconductor nanostructures is between the epitaxial structures. The semiconductor device structure also includes a gate stack wrapping around the semiconductor nanostructures. The semiconductor device structure further includes a stressor structure between the gate stack and the substrate. The epitaxial structures extend exceeding a top surface of the stressor structure.

In accordance with some embodiments, a semiconductor device structure is provided. The semiconductor device structure includes a semiconductor fin over a substrate and multiple channel structures stacked over the semiconductor fin. The semiconductor device structure also includes a gate stack wrapping around each of the channel structures and an epitaxial structure abutting the channel structures. The semiconductor device structure further includes a stressor structure between the substrate and the channel structures. The stressor structure contains oxygen and a semiconductor material other than silicon.

In accordance with some embodiments, a method for forming a semiconductor device structure is provided. The method includes forming a base layer over a semiconductor substrate and forming a semiconductor stack over the base layer. The semiconductor stack has multiple sacrificial layers and multiple semiconductor layers laid out alternately. The method also includes patterning the semiconductor stack and the base layer to form a fin structure and forming an isolation structure to surround a lower portion of the fin structure. A top surface of the isolation structure is higher than a top surface of the base layer. The method further includes removing the sacrificial layer to release multiple semiconductor nanostructures constructed by remaining portions of the semiconductor layers. In addition, the method includes transforming an upper portion or an entirety of the base layer into a stressor structure. The method also includes forming a metal gate stack to wrap around each of the semiconductor nanostructures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a plurality of semiconductor nanostructures over a substrate;
   two epitaxial structures over the substrate, wherein each of the semiconductor nanostructures is between the epitaxial structures;
   a gate stack wrapping around the semiconductor nanostructures; and
   a stressor structure between the gate stack and the substrate, wherein the epitaxial structures extend exceeding a top surface of the stressor structure, and the epitaxial structures extend exceeding a bottom surface of the stressor structure.

2. The semiconductor device structure as claimed in claim 1, wherein the gate stack wraps around each of the semiconductor nanostructures.

3. The semiconductor device structure as claimed in claim 1, wherein the stressor structure is made of a semiconductor oxide material.

4. The semiconductor device structure as claimed in claim 1, further comprising a plurality of inner spacers, wherein each of the inner spacers is between the gate stack and one of the epitaxial structures.

5. The semiconductor device structure as claimed in claim 4, wherein one of the inner spacers is in direct contact with the stressor structure and one of the epitaxial structures.

6. The semiconductor device structure as claimed in claim 4, wherein a bottom inner spacer of the inner spacers surrounds a bottom of one of the epitaxial structures such that an entirety of the epitaxial structures is above the bottom inner spacer.

7. The semiconductor device structure as claimed in claim 4, further comprising an edge element between two of the inner spacers, wherein the edge element and the semiconductor nanostructures are made of a same material, and the edge element is thinner than each of the semiconductor nanostructures.

8. The semiconductor device structure as claimed in claim 1, further comprising a semiconductor element between the stressor structure and the substrate, wherein the semiconductor element is made of a semiconductor material, and the stressor structure is made of an oxide material of the semiconductor material.

9. The semiconductor device structure as claimed in claim 8, wherein the semiconductor element is in direct contact with the stressor structure.

10. The semiconductor device structure as claimed in claim 1, further comprising a semiconductor element between the stressor structure and the substrate, wherein an interface between the semiconductor element and the stressor structure is a convex surface facing the semiconductor element.

11. A semiconductor device structure, comprising:
    a semiconductor fin over a substrate;
    a plurality of channel structures stacked over the semiconductor fin;
    a gate stack wrapping around each of the channel structures;
    an epitaxial structure abutting the channel structures;
    a stressor structure between the substrate and the channel structures, wherein the stressor structure contains oxygen and a semiconductor material other than silicon; and
    a semiconductor element between the stressor structure and the substrate, wherein an interface between the semiconductor element and the stressor structure is a convex surface facing the semiconductor element.

12. The semiconductor device structure as claimed in claim 11, further comprising an isolation structure surrounding the semiconductor fin and the stressor structure.

13. The semiconductor device structure as claimed in claim 12, wherein the stressor structure is in direct contact with the semiconductor fin, the isolation structure, and the gate stack.

14. The semiconductor device structure as claimed in claim 11, wherein the epitaxial structures extend exceeding a top surface and a bottom surface of the stressor structure.

15. The semiconductor device structure as claimed in claim 11, further comprising an inner spacer in direct contact with the epitaxial structure and the stressor structure.

16. A method for forming a semiconductor device structure, comprising:
    forming a base layer over a semiconductor substrate;
    forming a semiconductor stack over the base layer, wherein the semiconductor stack has a plurality of sacrificial layers and a plurality of semiconductor layers laid out alternately;
    patterning the semiconductor stack and the base layer to form a fin structure;
    forming an isolation structure to surround a lower portion of the fin structure, wherein a top surface of the isolation structure is higher than a top surface of the base layer;
    removing the sacrificial layer to release a plurality of semiconductor nanostructures constructed by remaining portions of the semiconductor layers;
    transforming at least an upper portion of the base layer into a stressor structure;

forming a metal gate stack to wrap around each of the semiconductor nanostructures;

forming a protective layer over the base layer before the semiconductor stack is formed; and partially removing the protective layer after the semiconductor nanostructures are formed so that the base layer is exposed.

17. The method for forming a semiconductor device structure as claimed in claim 16, wherein materials of the protective layer and the semiconductor layers are the same, and materials of the base layer and the sacrificial layers are the same.

18. The method for forming a semiconductor device structure as claimed in claim 16, wherein the stressor structure is formed by at least partially oxidizing the base layer.

19. The method for forming a semiconductor device structure as claimed in claim 18, wherein a lower portion of the base layer is not transformed into the stressor structure.

20. The method for forming a semiconductor device structure as claimed in claim 16, further comprising:

partially removing the fin structure to form a recess exposing side surfaces of the semiconductor layers and the sacrificial layers;

forming inner spacers to cover the side surfaces of the sacrificial layers; and forming a source/drain structure to at least partially fill the recess after the inner spacers are formed.

* * * * *